(12) United States Patent
Kanike et al.

(10) Patent No.: US 8,993,402 B2
(45) Date of Patent: Mar. 31, 2015

(54) METHOD OF MANUFACTURING A BODY-CONTACTED SOI FINFET

(75) Inventors: Narasimhulu Kanike, Wayne, NJ (US); Deleep R. Nair, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 106 days.

(21) Appl. No.: 13/587,288

(22) Filed: Aug. 16, 2012

(65) Prior Publication Data
US 2014/0048881 A1 Feb. 20, 2014

(51) Int. Cl.
| | |
|---|---|
| H01L 21/331 | (2006.01) |
| H01L 29/66 | (2006.01) |
| H01L 29/78 | (2006.01) |
| H01L 29/786 | (2006.01) |

(52) U.S. Cl.
CPC ........ H01L 29/785 (2013.01); H01L 29/66545 (2013.01); H01L 29/66795 (2013.01); H01L 29/78615 (2013.01)
USPC ............................ 438/311; 438/478; 257/347

(58) Field of Classification Search
CPC ............ H01L 21/2022; H01L 21/2033; H01L 21/823431; H01L 21/845; H01L 27/1203; H01L 27/1211; H01L 29/66795; H01L 29/785; H01L 29/7851; H01L 29/42392; H01L 29/66621
USPC ............ 438/311, 478, 589; 257/347, E21.09, 257/E27.112
See application file for complete search history.

(56) References Cited

U.S. PATENT DOCUMENTS

| | | | |
|---|---|---|---|
| 6,913,960 B2 | 7/2005 | Bryant et al. | |
| 7,485,520 B2 | 2/2009 | Zhu et al. | |
| 2004/0256634 A1* | 12/2004 | Sugihara et al. | 257/192 |
| 2006/0091463 A1 | 5/2006 | Donze et al. | |
| 2008/0132077 A1* | 6/2008 | Morishima | 438/704 |
| 2008/0233699 A1* | 9/2008 | Booth et al. | 438/283 |
| 2009/0001464 A1 | 1/2009 | Booth, Jr. et al. | |
| 2009/0008705 A1* | 1/2009 | Zhu et al. | 257/327 |
| 2011/0068407 A1* | 3/2011 | Yeh et al. | 257/369 |
| 2011/0147842 A1* | 6/2011 | Cappellani et al. | 257/365 |

* cited by examiner

*Primary Examiner* — Khiem D Nguyen
(74) *Attorney, Agent, or Firm* — Steven M. Kellner; H. Daniel Schnurmann

(57) ABSTRACT

A semiconductor structure including a body-contacted fin-FET device and methods form manufacturing the same. The method may include forming one or more semiconductor fins on a SOI substrate, forming a semiconductive body contact region connected to the bottom of the fin(s) in the buried insulator region, forming a sacrificial gate structure over the body region of the fin(s), forming a source region on one end of the fin(s), forming a drain region on the opposite end of the fin(s), replacing the sacrificial gate structure with a metal gate, and forming electrical contacts to the source, drain, metal gate, and body contact region. The method may further include forming a body contact fin contemporaneously with the finFET fins that is in contact with the body contact region, through which electrical contact to the body contact region is made.

5 Claims, 26 Drawing Sheets

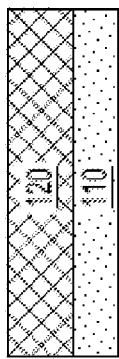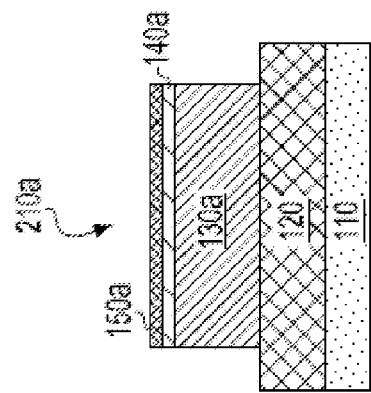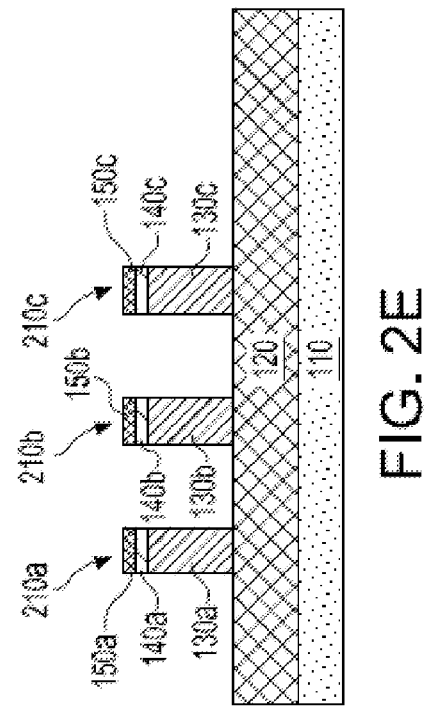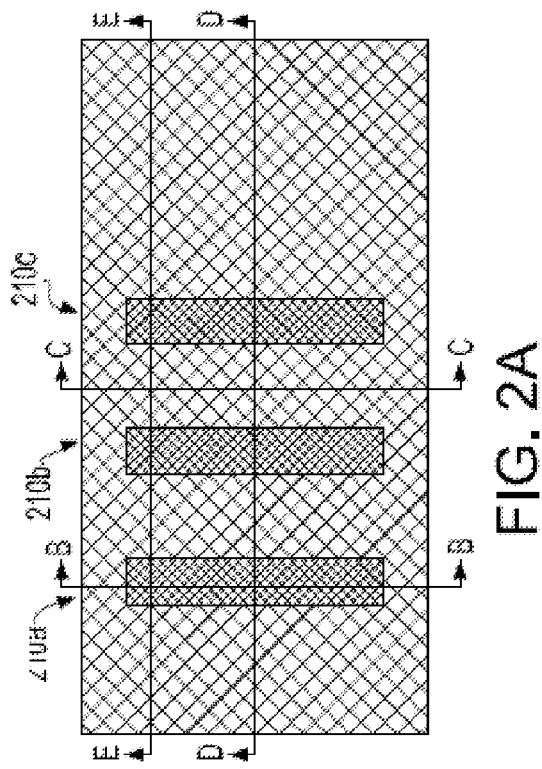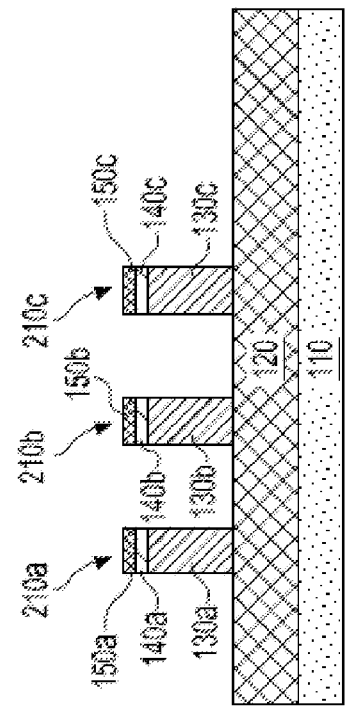

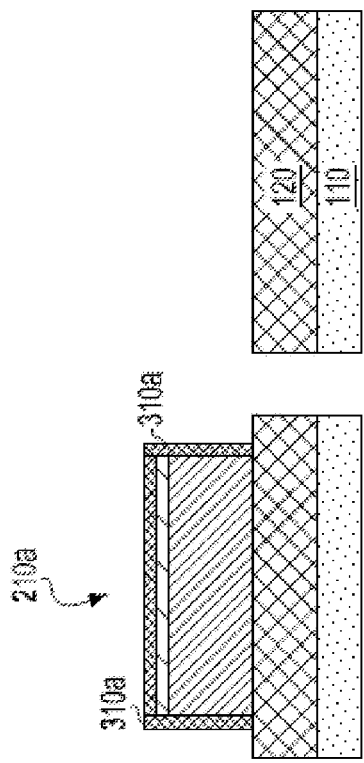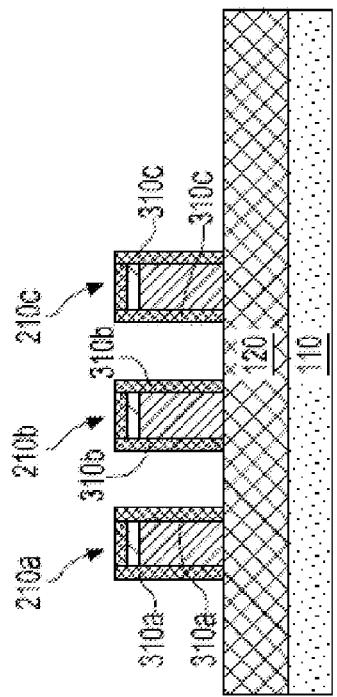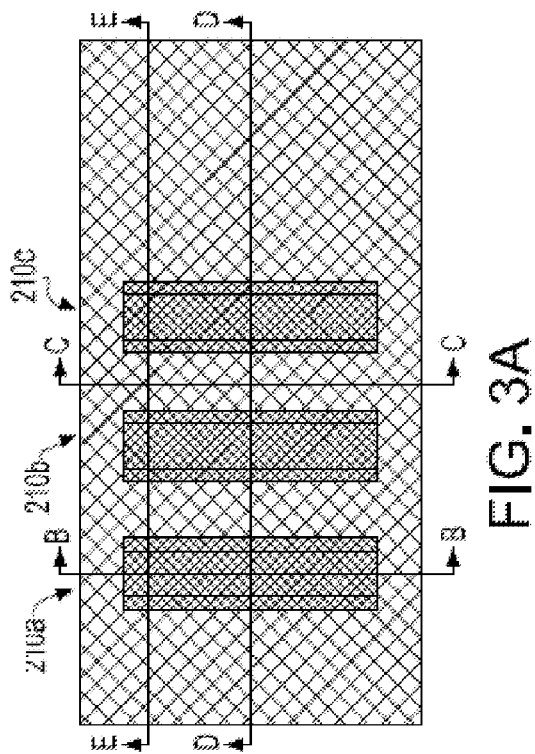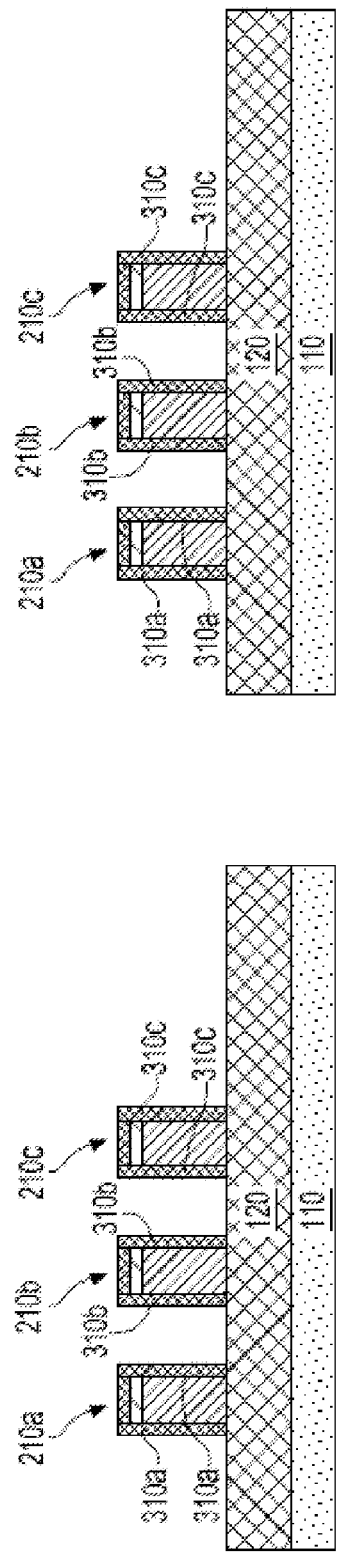
FIG. 3A
FIG. 3B
FIG. 3C
FIG. 3D
FIG. 3E

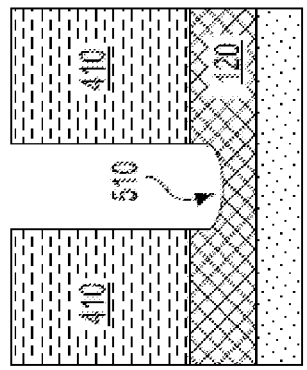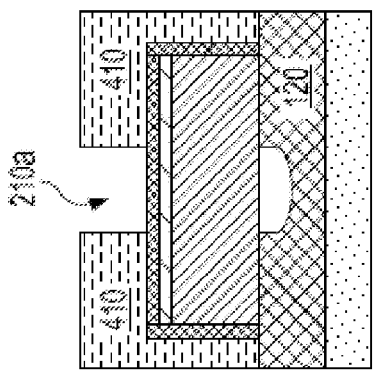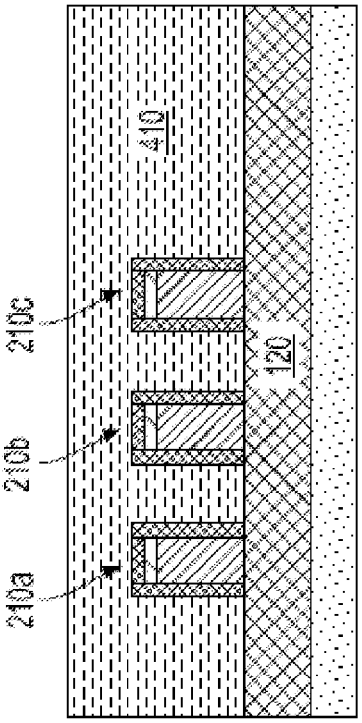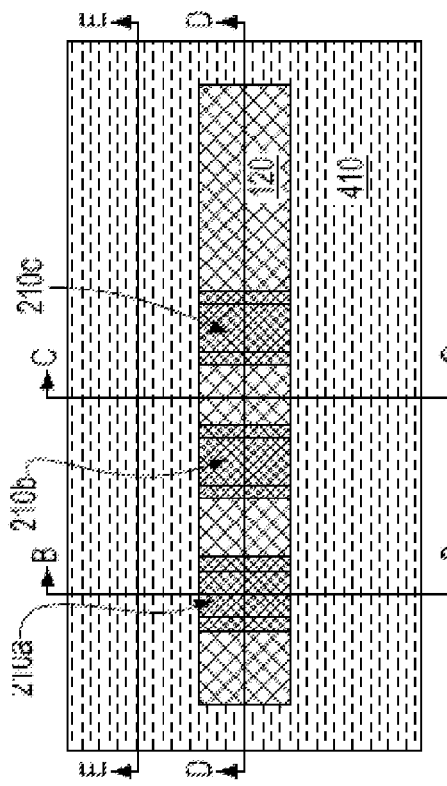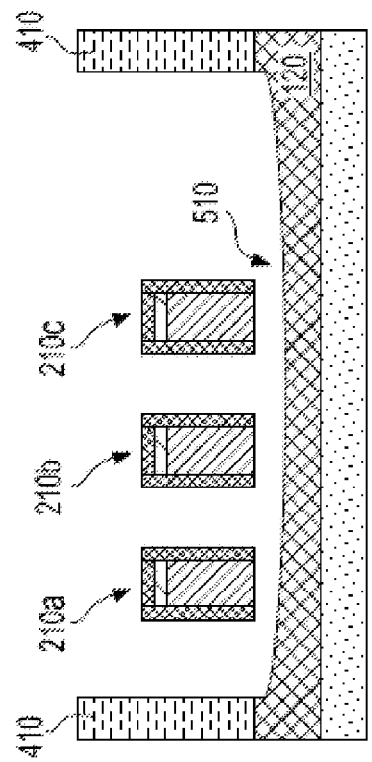

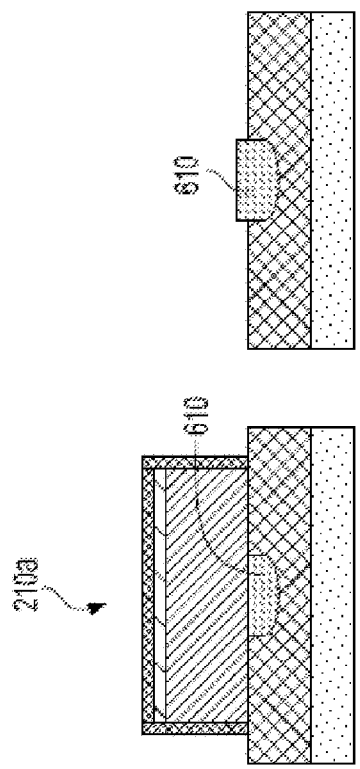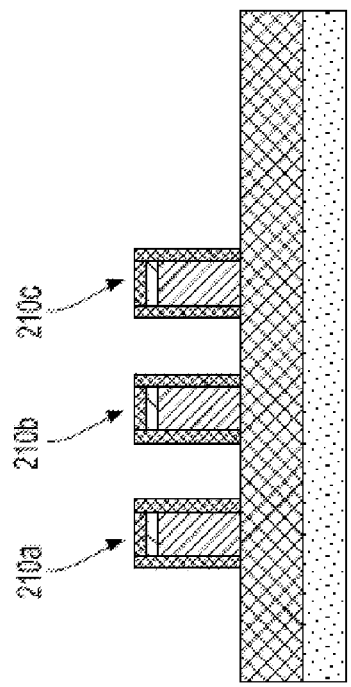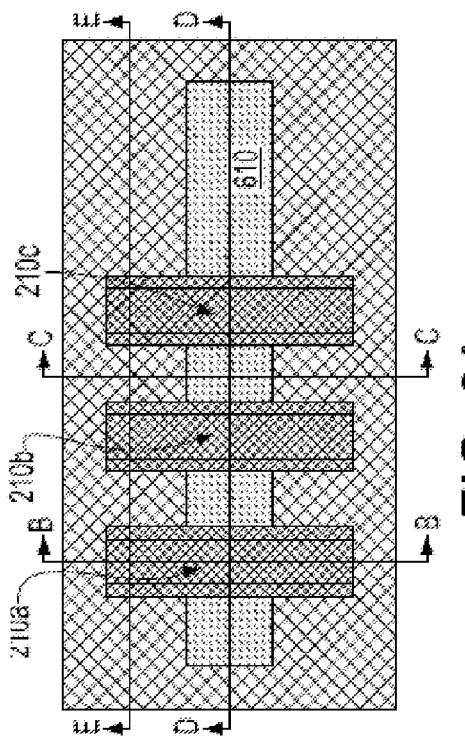

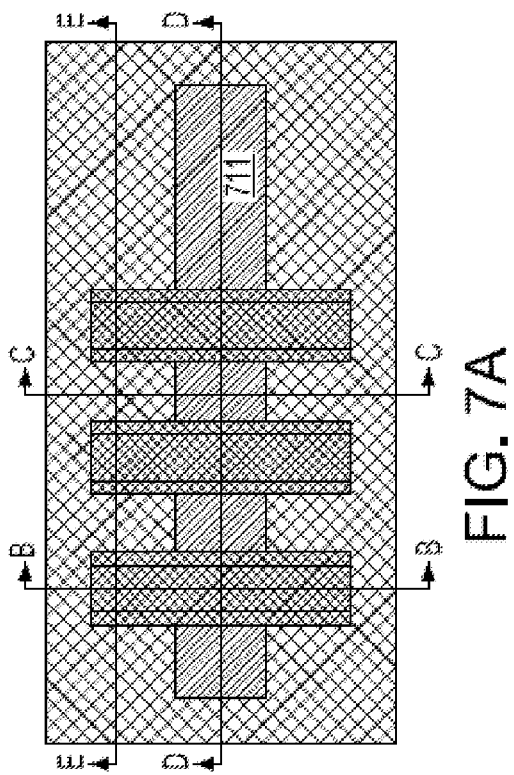
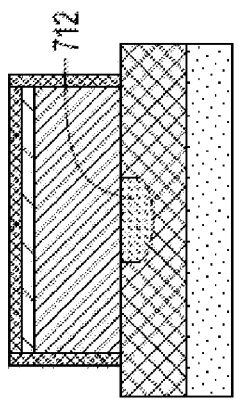
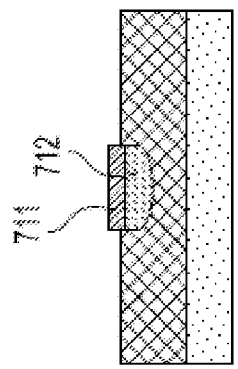
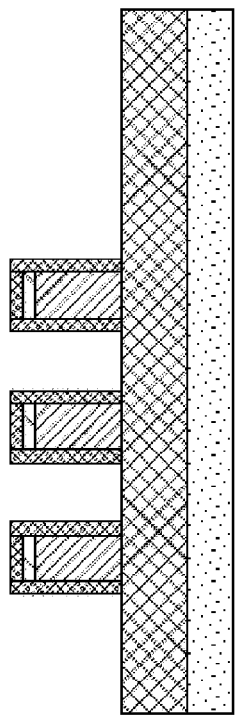
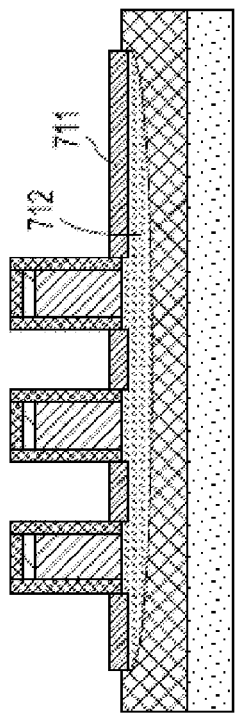

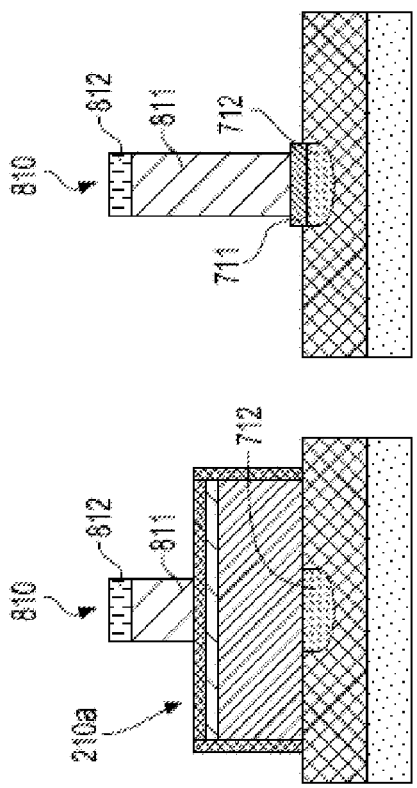
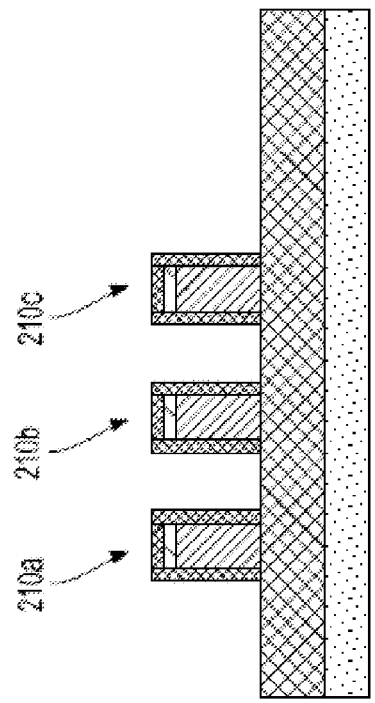
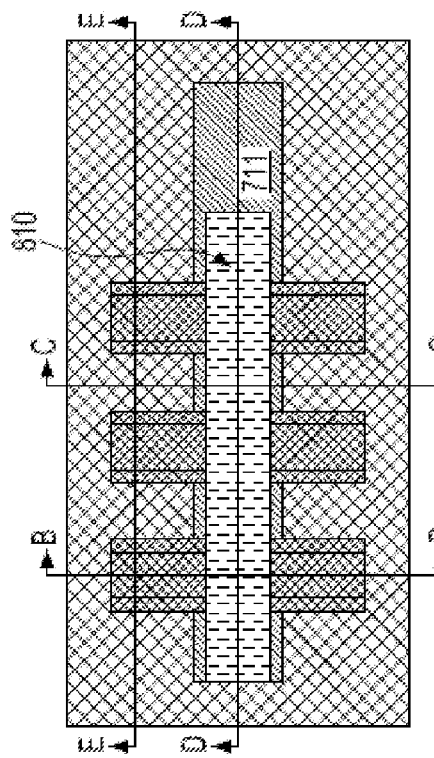
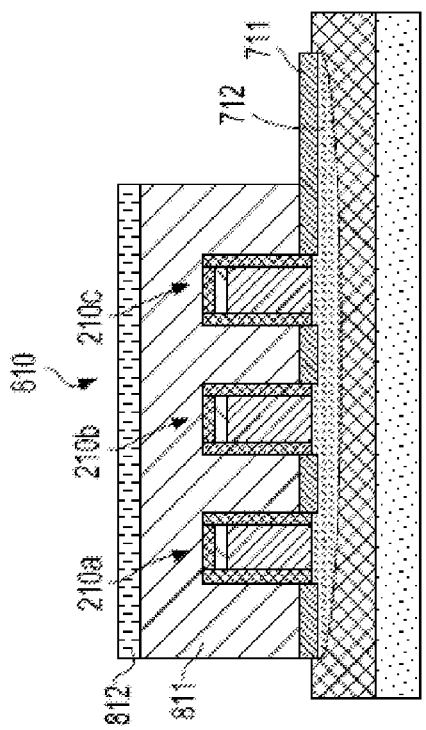
FIG. 8A
FIG. 8B
FIG. 8C
FIG. 8D
FIG. 8E

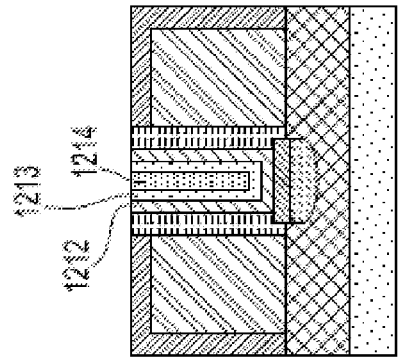
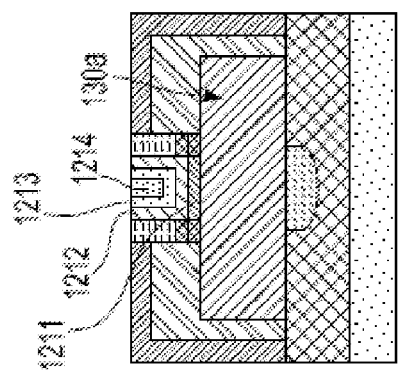
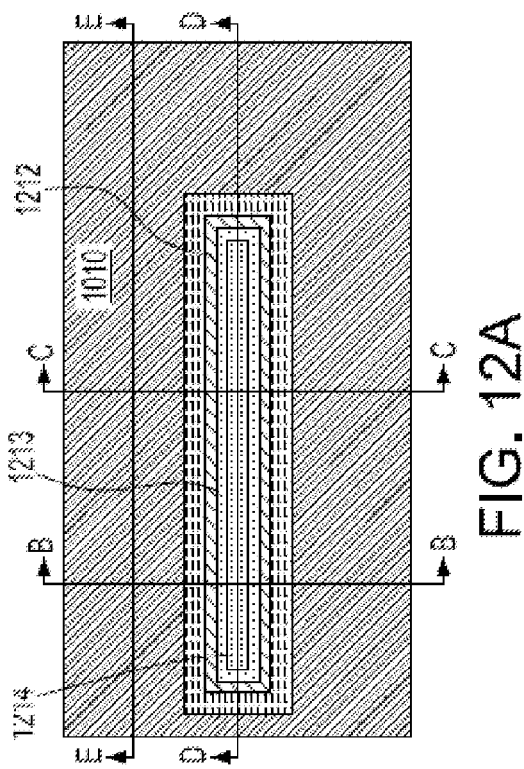
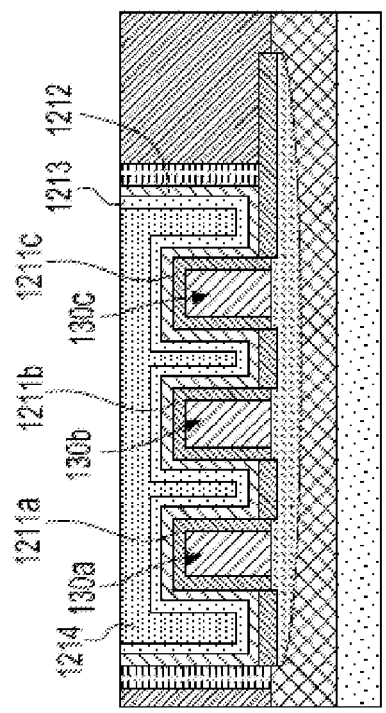
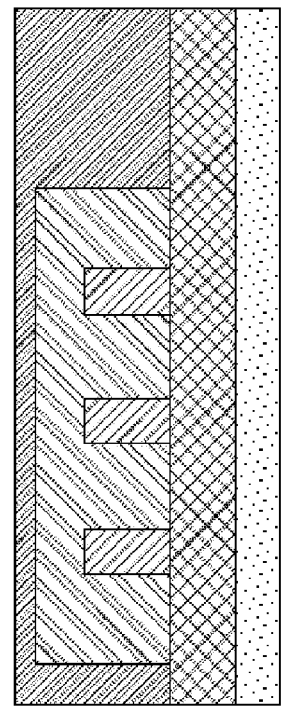

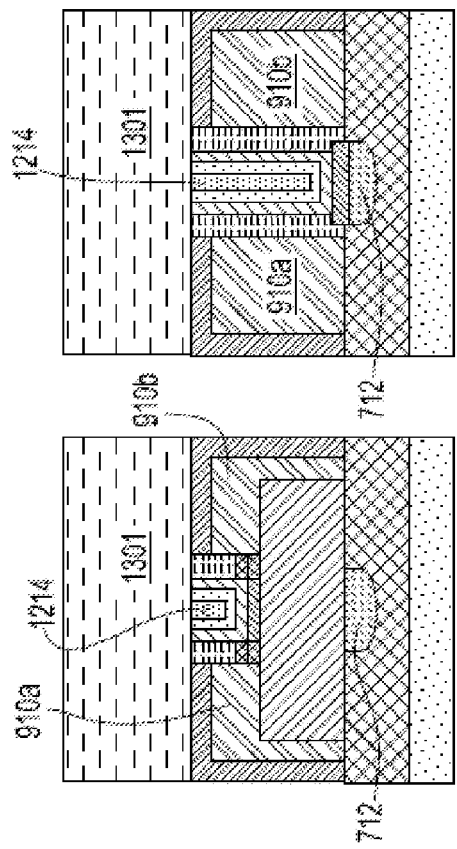
FIG. 13A
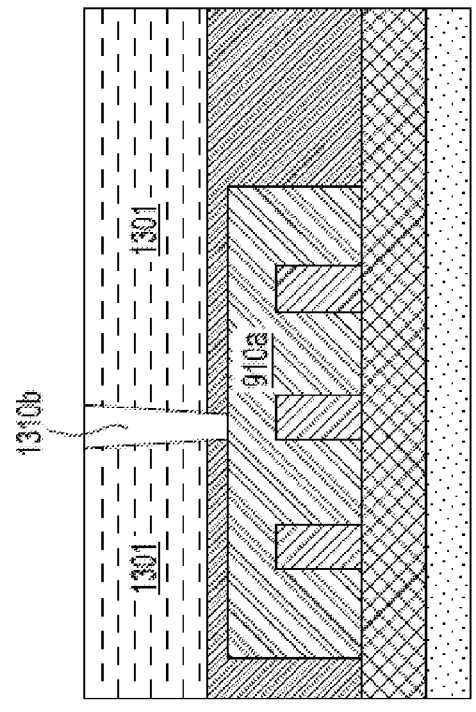
FIG. 13B
FIG. 13C
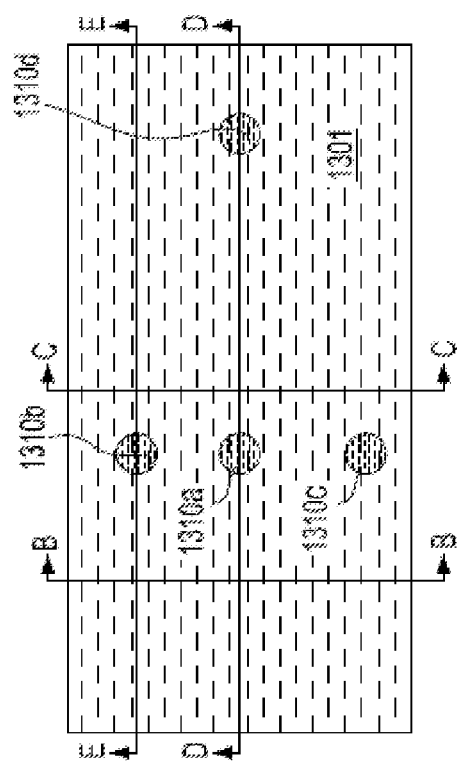
FIG. 13D
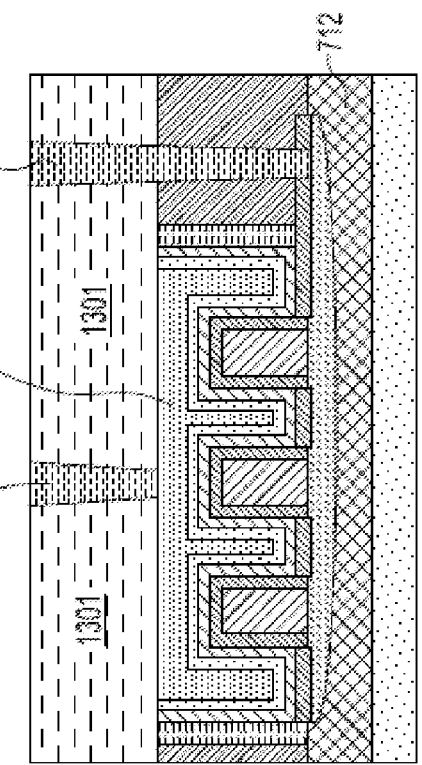
FIG. 13E

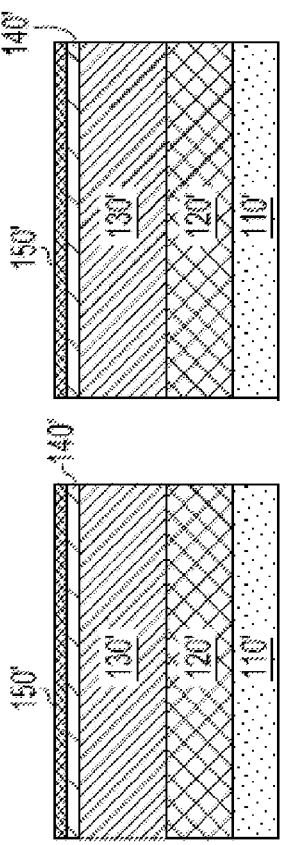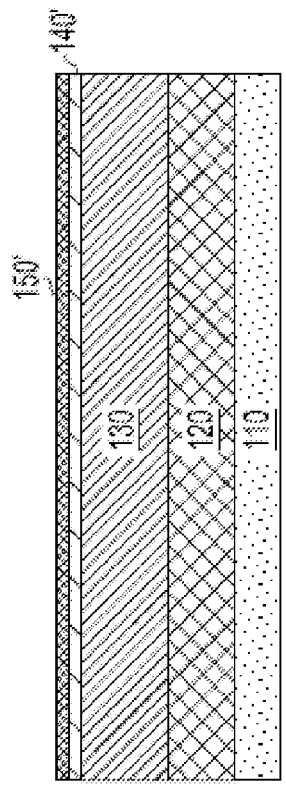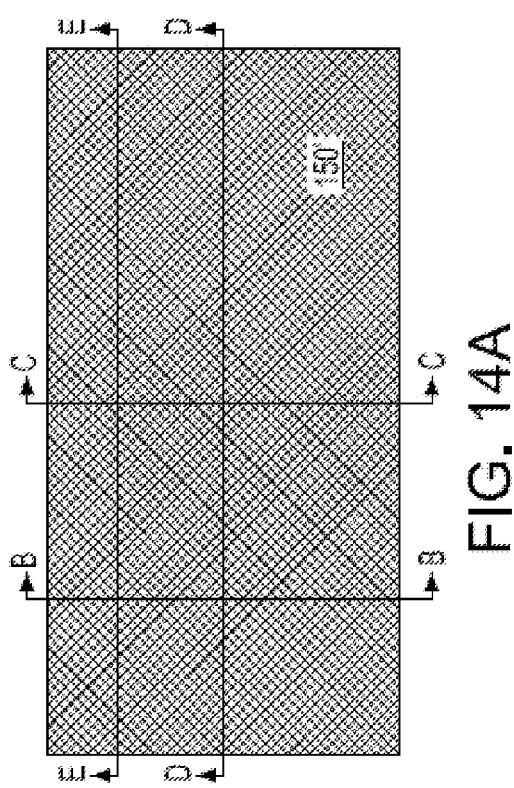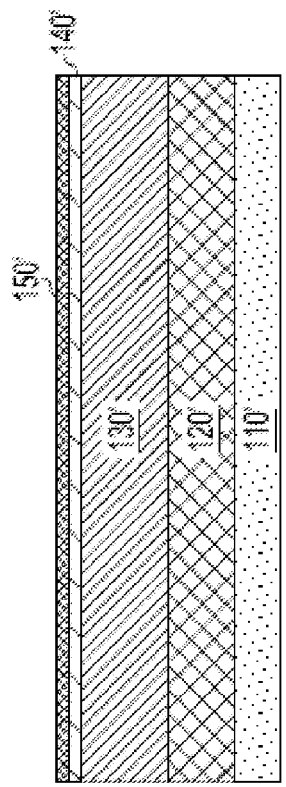

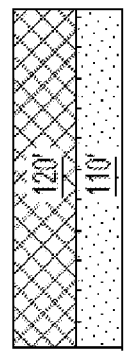
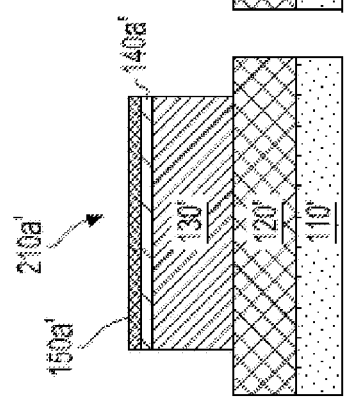
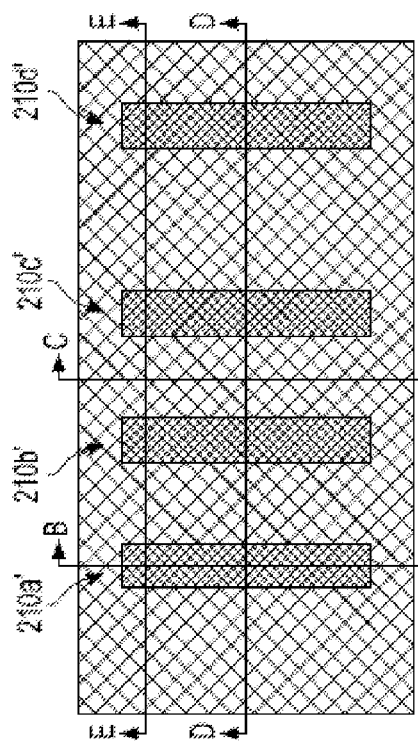
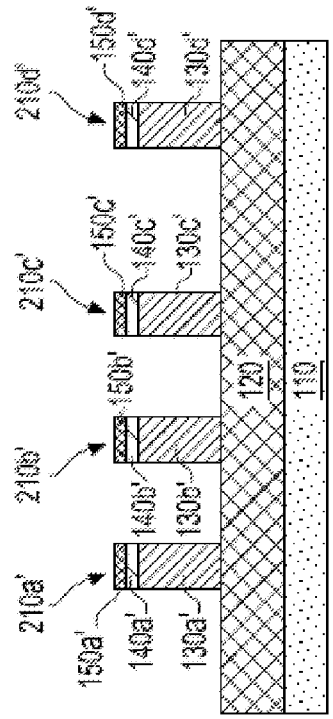
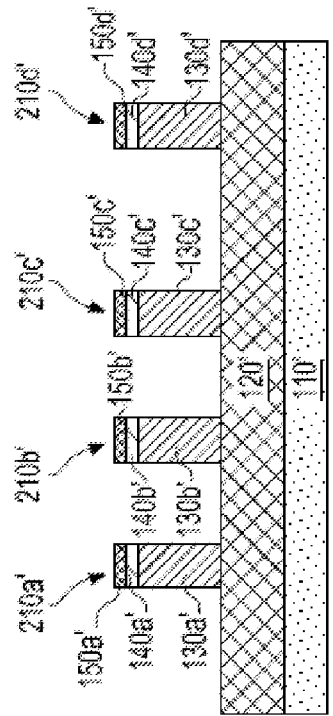

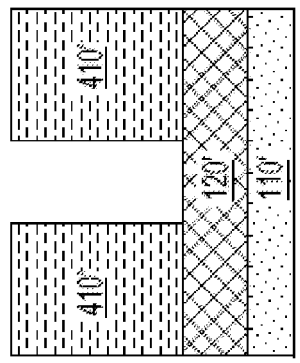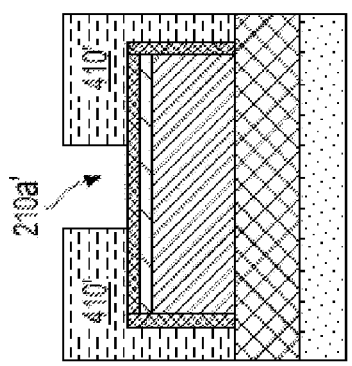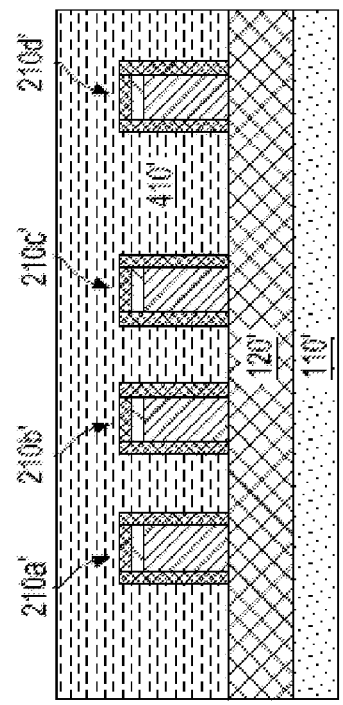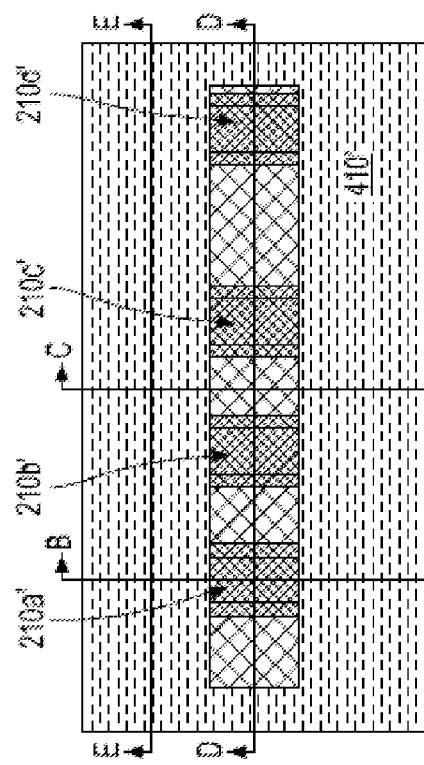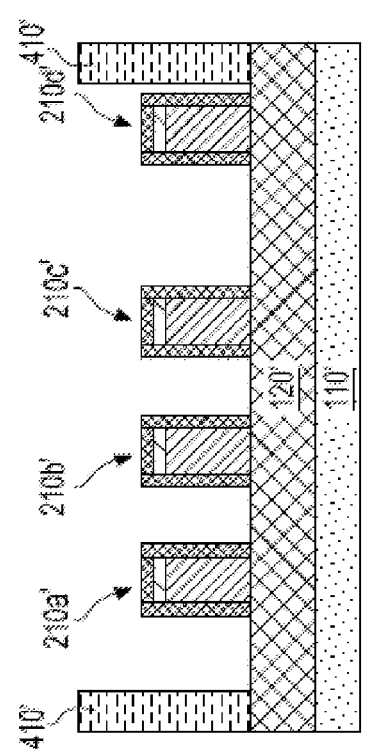

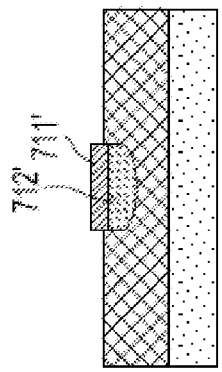
FIG. 20A
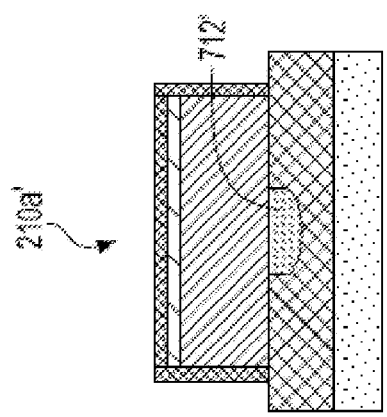
FIG. 20B
FIG. 20C
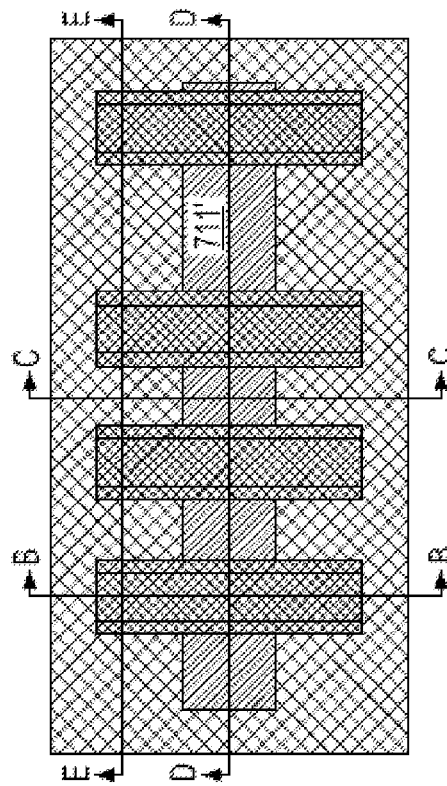
FIG. 20D
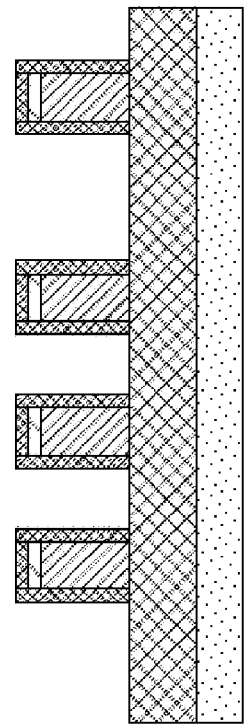
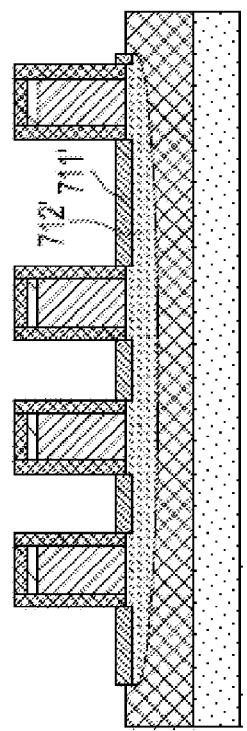
FIG. 20E

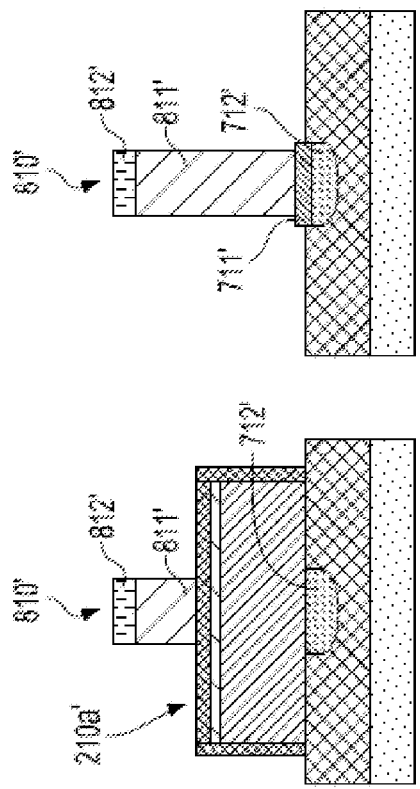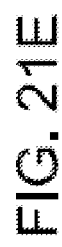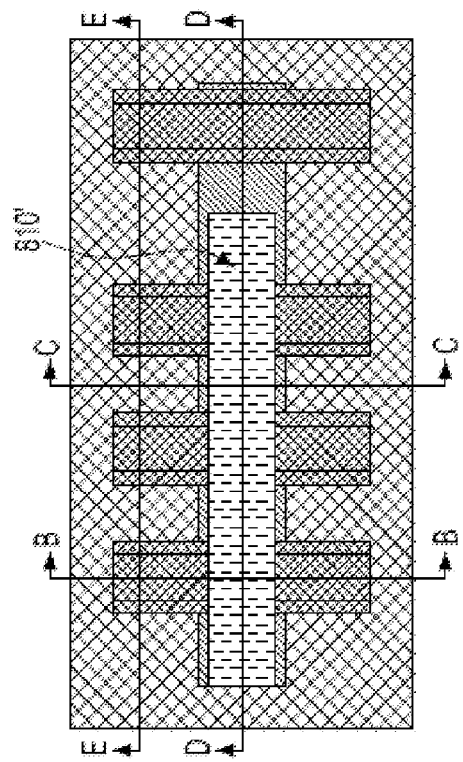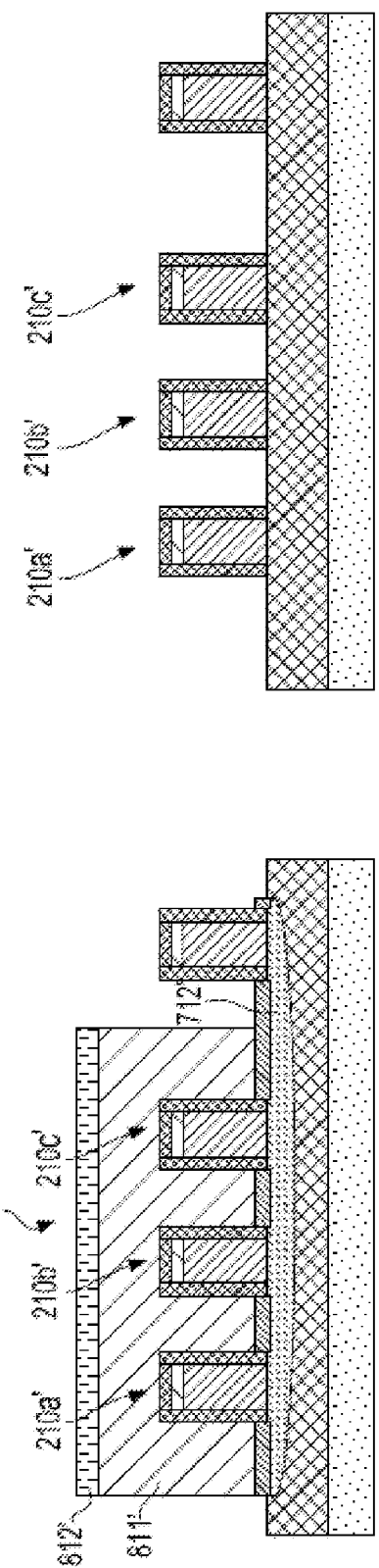

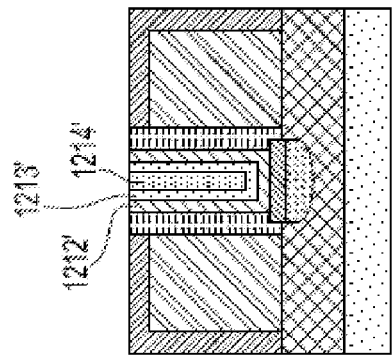
FIG. 25C
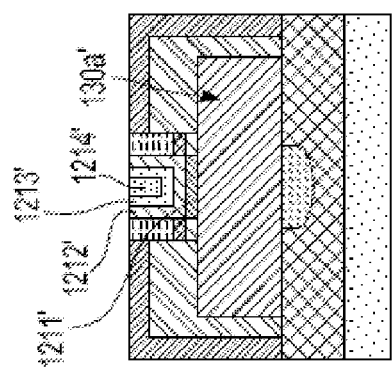
FIG. 25B
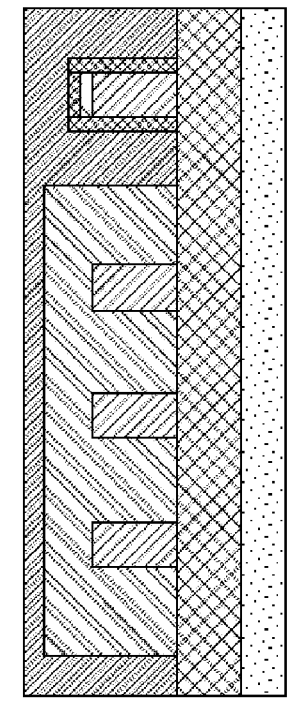
FIG. 25E
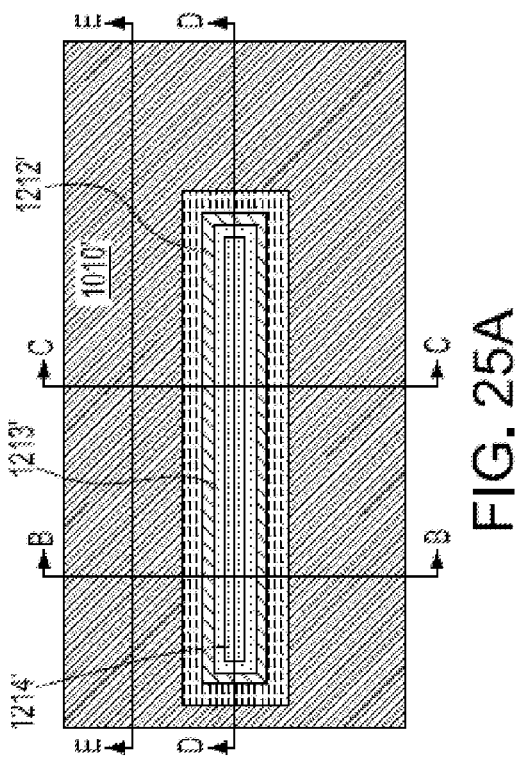
FIG. 25A
FIG. 25D

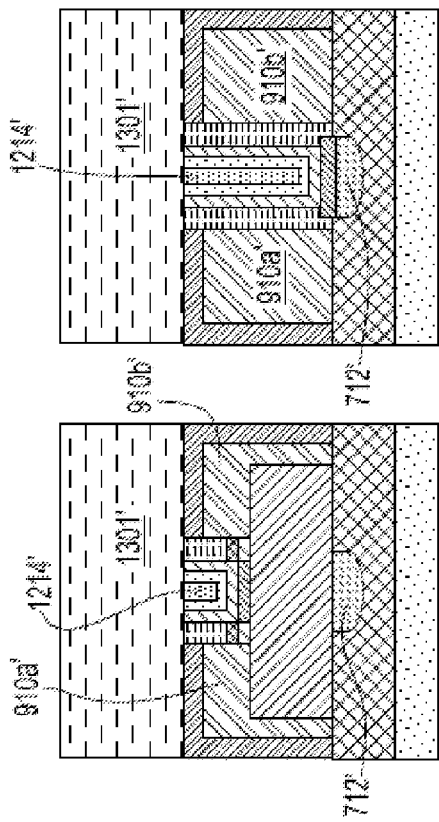
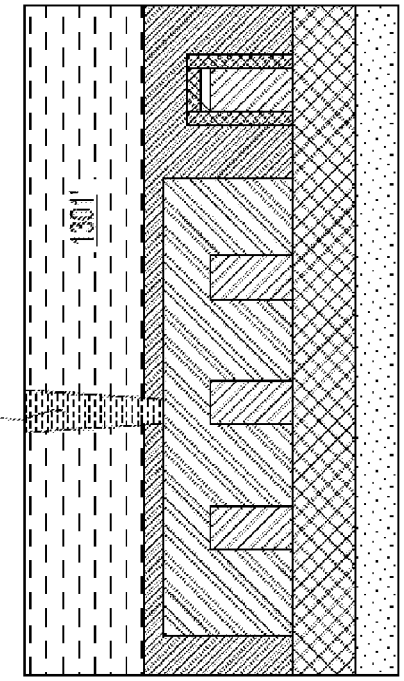
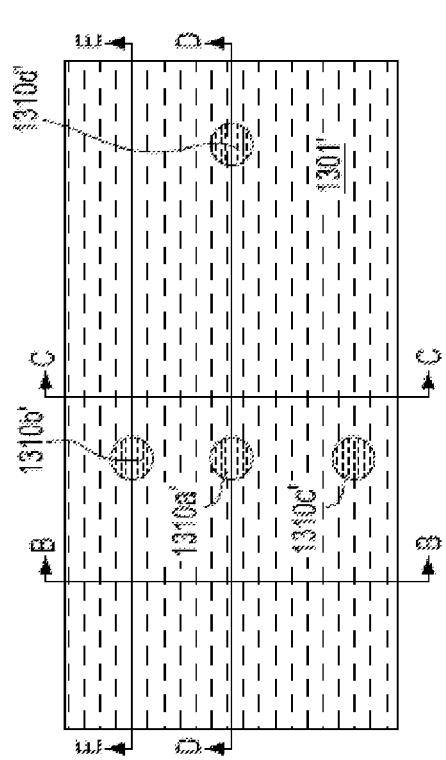
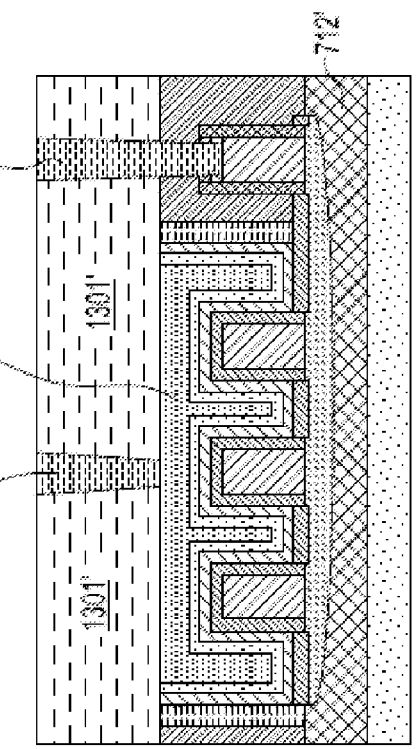

US 8,993,402 B2

METHOD OF MANUFACTURING A BODY-CONTACTED SOI FINFET

FIELD OF THE INVENTION

The present invention generally relates to semiconductor devices, and particularly methods of manufacturing body-contacted finFET devices.

BACKGROUND

Fin metal-oxide-semiconductor field effect transistor (Fin-MOSFET) is an emerging technology which provides solutions to metal-oxide-semiconductor field effect transistor (MOSFET) scaling problems at, and below, the 22 nm node. FinMOSFET structures include fin field effect transistors (finFETs) which include at least one narrow semiconductor fin gated on at least two opposing sides of each of the at least one semiconductor fin. FinFET structures may be formed on a semiconductor-on-insulator (SOI) substrate, because of the low source/drain diffusion to substrate capacitance and ease of electrical isolation by shallow trench isolation structures.

However, finFETs fabricated on an SOI substrate suffer from floating body effects, depending on fin thickness, as is well-known for conventional planar MOSFETs. The body of a finFET on an SOI substrate stores charge which is a function of the history of the device, hence becoming a floating body. As such, floating body finFETs experience threshold voltages which are difficult to anticipate and control, and which vary in time. The body charge storage effects result in dynamic sub-threshold voltage (sub-Vt) leakage and threshold voltage (Vt) mismatch among geometrically identical adjacent devices. Floating body effects in finFETs are particularly a concern in static random access memory (sRAM) cells, where Vt matching is extremely important as operating voltages continue to be scaled down. The floating body effects also pose leakage problems for pass gate devices. Further, one of the key concerns of floating body devices is the output conductance instability, a very important factor for analog circuit applications. In view of the above stated problems with finFETs fabricated on SOI substrates, it is desirable to eliminate body effects by building finFETs incorporating body contacts. In addition to this, having a body contact enables devices with multiple threshold voltages by controlling the body voltage.

Methods exist in the prior art for fabricating body-contacted finFETs. However, the prior art designs feature limitations that limit their application to finFETs with only a single fin. For example, U.S. Patent Application Publication No. US 2009/001464 A1 provides for a single-fin finFET with a body contact on the top surface of the fin, formed through the gate. Adapting this method for a multi-fin finFET would at least require forming a separate individual contact to each fin, greatly increasing process complexity, and is potentially impossible due to insufficient space to form multiple body-contacts. U.S. Pat. No. 7,485,520 provides for a single-fin finFET design, where a body contact is formed by removing material from a lower portion of a fin which rests on an adjacent semiconductor substrate, replacing the removed material with an insulating material to isolate the fin, and then forming a contact to the adjacent semiconductor substrate. The complexity of this process would be further increased if adapted to multi-fin designs, where the proximity of adjacent fins would reduce the efficacy of processes to add or remove material from lower portions of the fins. Therefore, a new method of forming body contacts for multi-fin finFETs is desirable.

SUMMARY

According to one embodiment of the present disclosure, a semiconductor structure comprising a finFET device with a body contact is provided. The structure may include one or more semiconductor fins on an silicon-on-insulator (SOI) substrate, a gate on the body region of the fin(s), a source contacting one end of the fin(s), a region contacting the opposite end of the fin(s), a semiconductive body-contact region formed in the insulator layer of the SOI substrate, where the body-contact region contacts the bottom of the fin(s), and electrical contacts formed to the source, the drain, the gate, and the body-contact region. Another embodiment may further include an additional fin formed on the SOI substrate in contact with the body-contact region, with the electrical contact to the body-contact region being formed through the additional fin.

According to another embodiment of the present disclosure, a method of manufacturing a semiconductor structure including a body-contacted finFET is provided. The method may include etching the top semiconductive layer of a SOI substrate to form at least one fin on the buried insulator layer, etching partially into the buried insulator underneath the fin(s) to form a recess region, filling the recess region with a semiconductive material to from a body-contact region in contact with the bottom of the fin(s), forming an insulator layer on the exposed top surface of the body contact, forming a sacrificial gate structure contacting the body region of the fin(s) but not fully covering the body contact region, forming a source contacting one end of the fin(s), forming a drain contacting the opposite end of the fin(s), replacing the sacrificial gate structure with a metal gate, and forming electrical contacts to the metal gate, the source, the drain, and the body-contact region.

According to another embodiment of the present disclosure, another method of manufacturing a semiconductor structure including a body-contacted finFET is provided. The method may include etching the top semiconductive layer of a SOI substrate to form at least one finFET fin and a body-contact fin on the buried insulator layer, etching partially into the buried insulator underneath the fins to form a recess region, filling the recess region with a semiconductive material to form a body-contact region in contact with the bottom of the fins, forming an insulator layer on the exposed top surface of the body-contact region, forming a sacrificial gate structure contacting the body region of the finFET fin(s) but not covering the body-contact fin, forming a source contacting one end of the finFET fin(s), forming a drain contacting the opposite end of the finFET fin(s), replacing the sacrificial gate structure with a metal gate, and forming electrical contacts to the metal gate, the source, the drain, and the body-contact fin.

BRIEF DESCRIPTION OF THE SEVERAL VIEWS OF THE DRAWINGS

FIGS. 1A-13E show sequential steps of an exemplary finFET structure according to a first embodiment of the present invention. Figures with the suffix "A" are top-down views of the exemplary structure. Figures with the suffix "B", "C", "D", or "E" are vertical cross-sectional views of the exemplary structure along the plane indicated by line B, C, D, or E of the corresponding figure with the same numeric label and the suffix "A."

FIGS. 14A-26E show sequential steps of an exemplary finFET structure according to another embodiment of the present invention. Figures with the suffix "A" are top-down views of the exemplary structure. Figures with the suffix "B", "C", "D", or "E" are vertical cross-sectional views of the exemplary structure along the plane indicated by line B, C, D, or E of the corresponding figure with the same numeric label and the suffix "A."

Figure 1A:
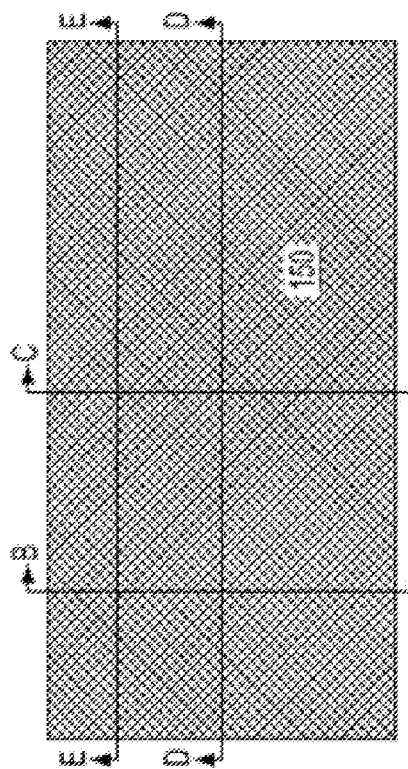
Figure 1B:
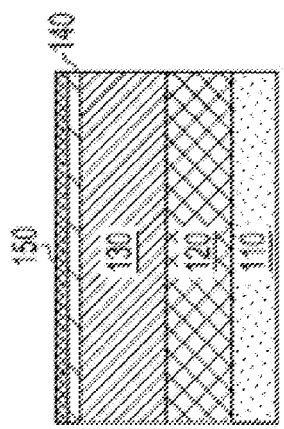
Figure 1C:
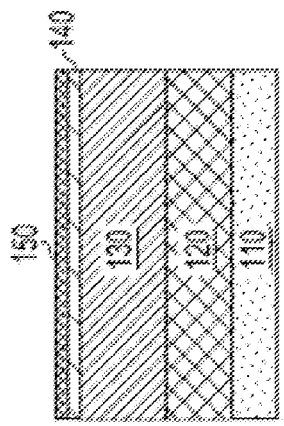
Figure 1D:
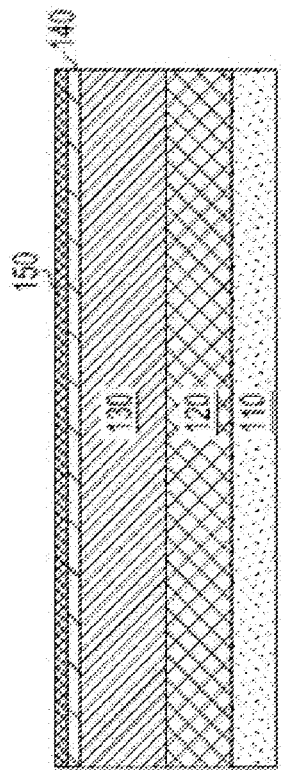
Figure 1E:
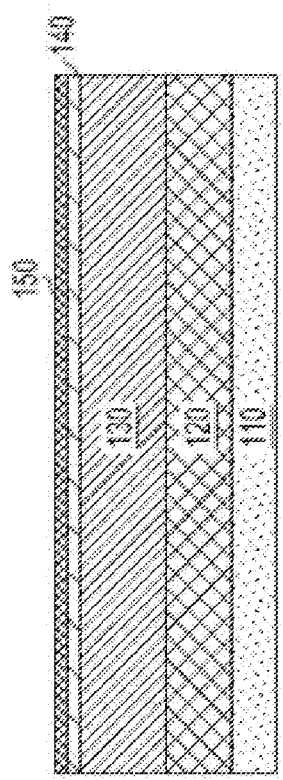
Figure 4C:
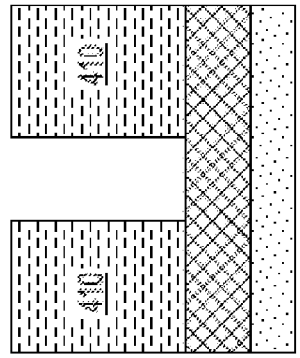
Figure 4B:
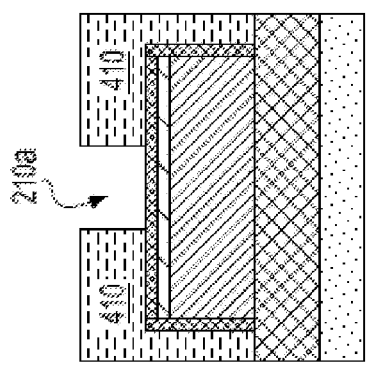
Figure 4E:
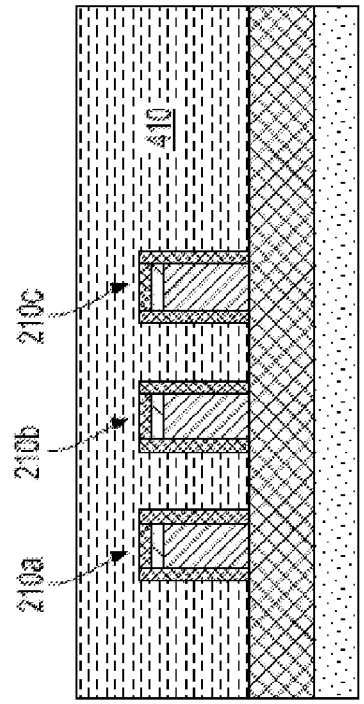
Figure 4A:
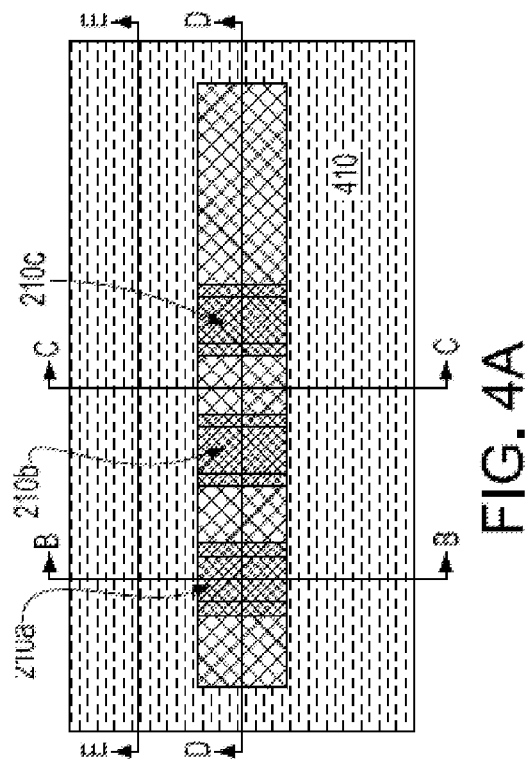
Figure 4D:
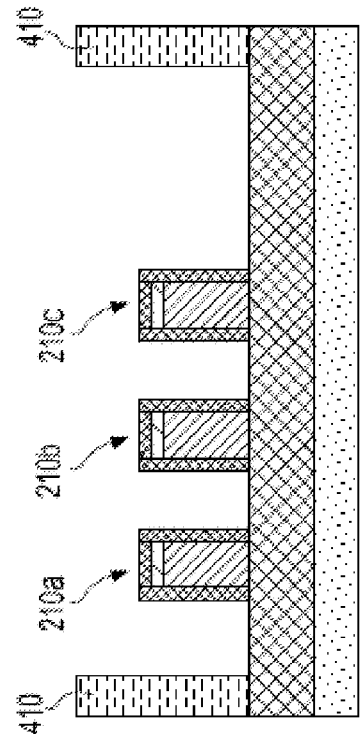
Figure 9C:
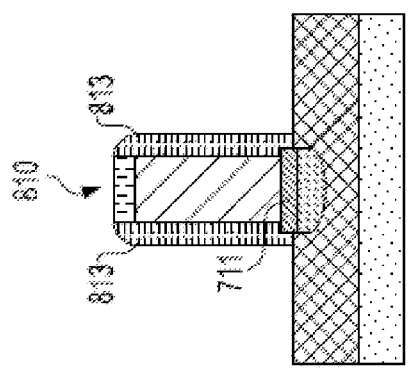
Figure 9B:
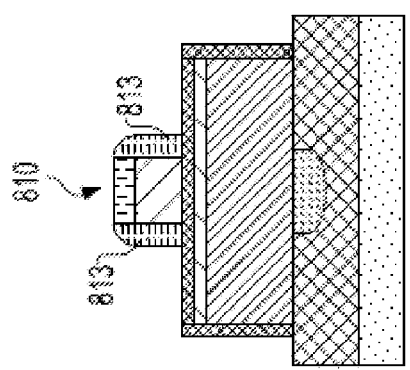
Figure 9E:
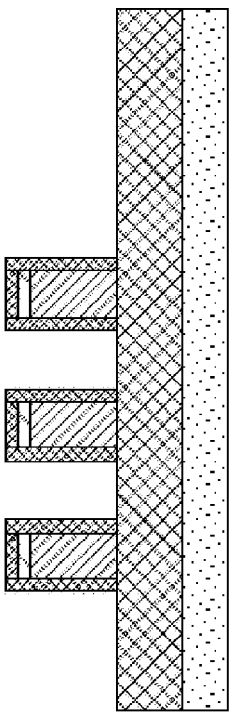
Figure 9A:
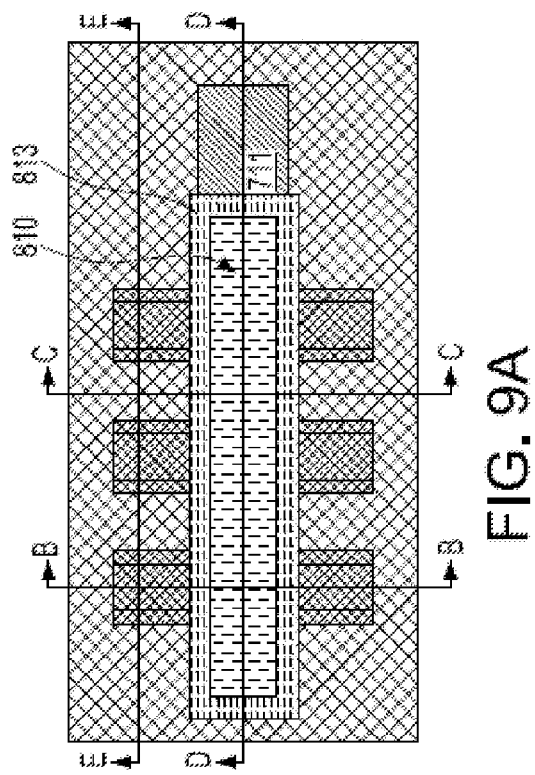
Figure 9D:
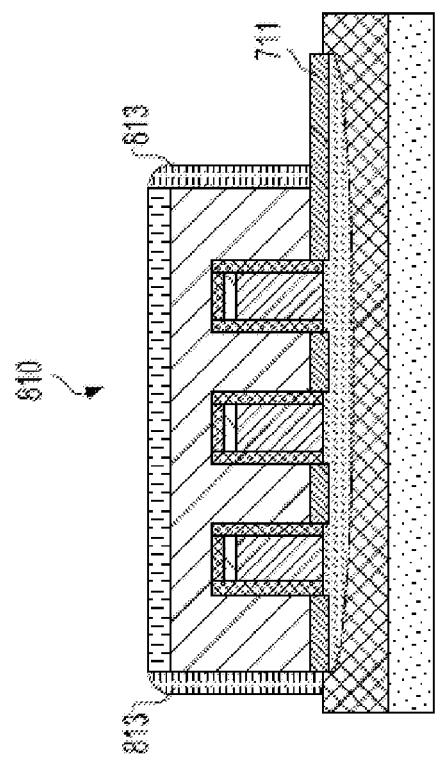
Figure 10A:
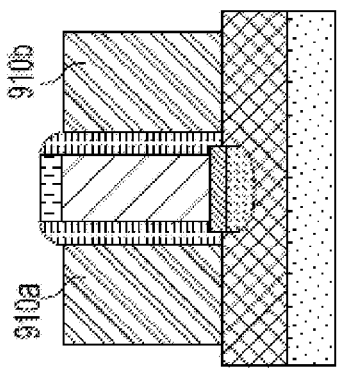
Figure 10B:
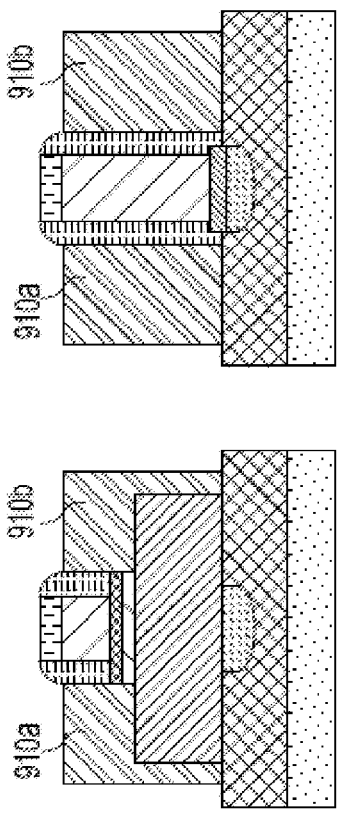
Figure 10C:
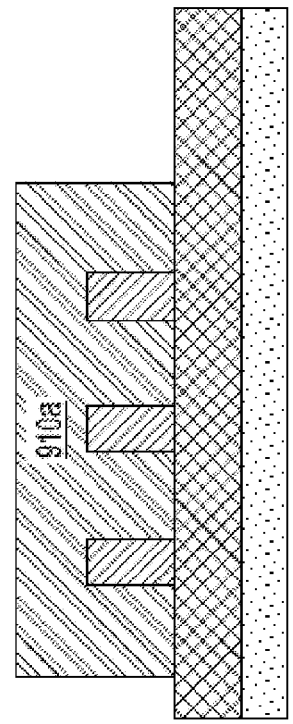
Figure 10D:
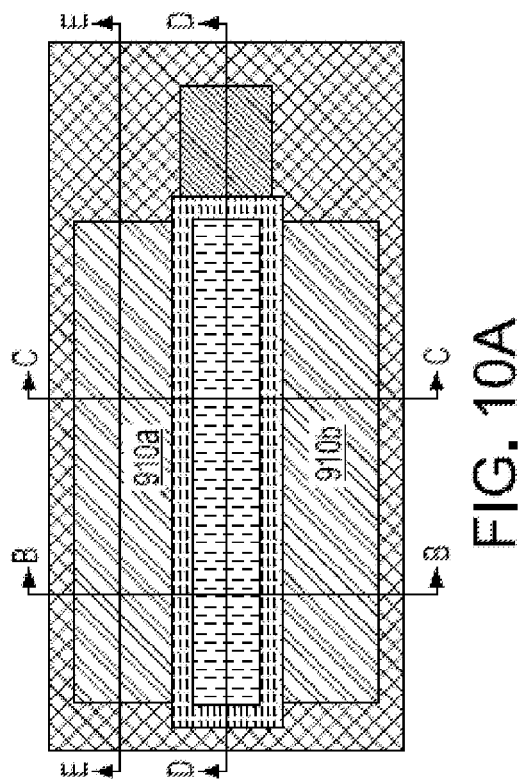
Figure 10E:
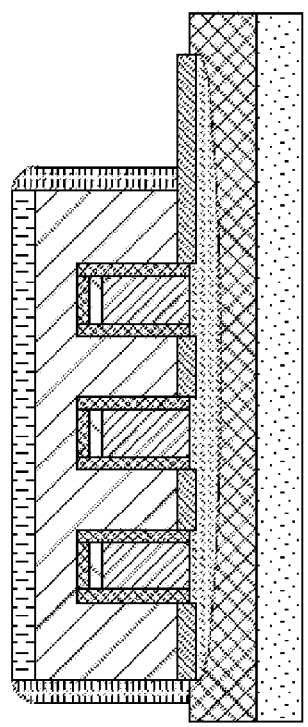
Figure 11B:
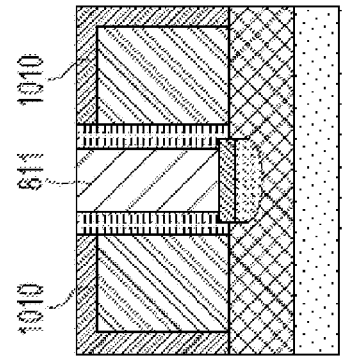
Figure 11C:
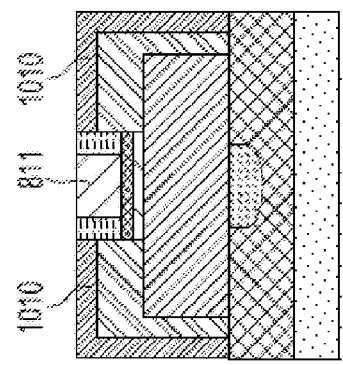
Figure 11E:
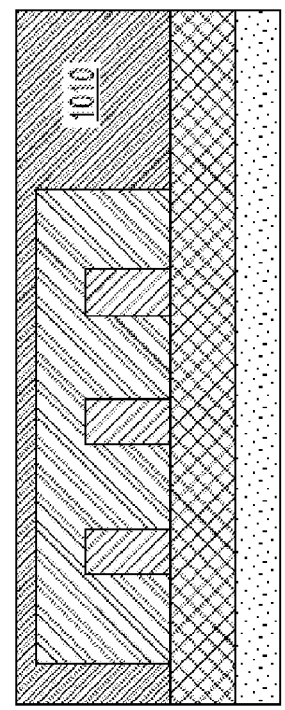
Figure 11A:
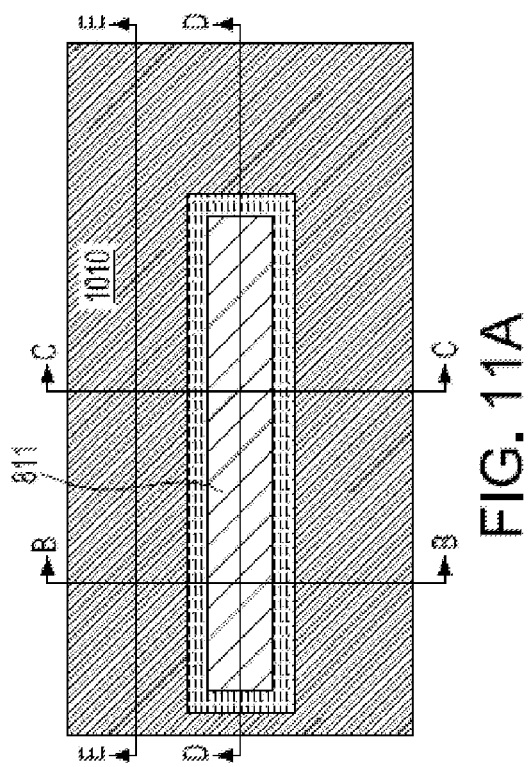
Figure 11D:
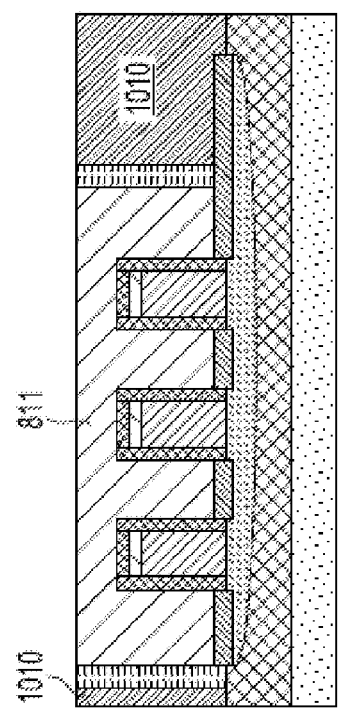
Figure 16A:
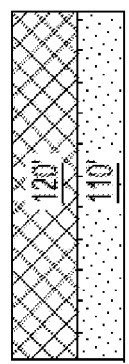
Figure 16B:
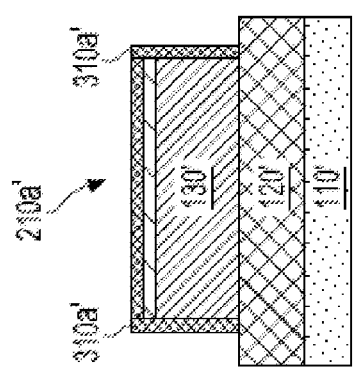
Figure 16C:
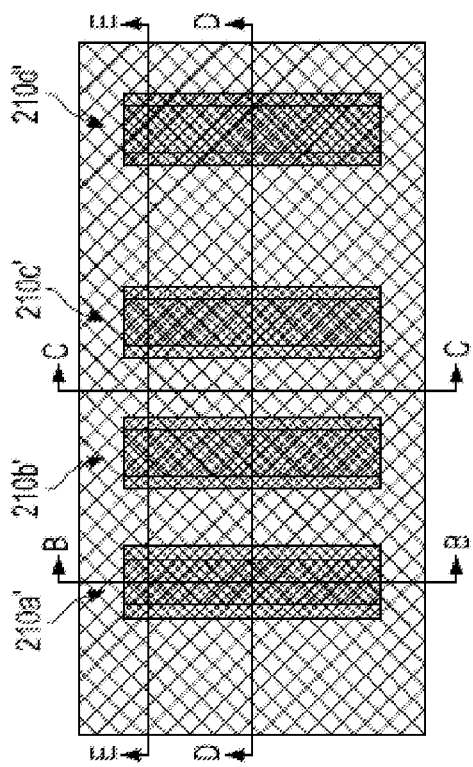
Figure 16D:
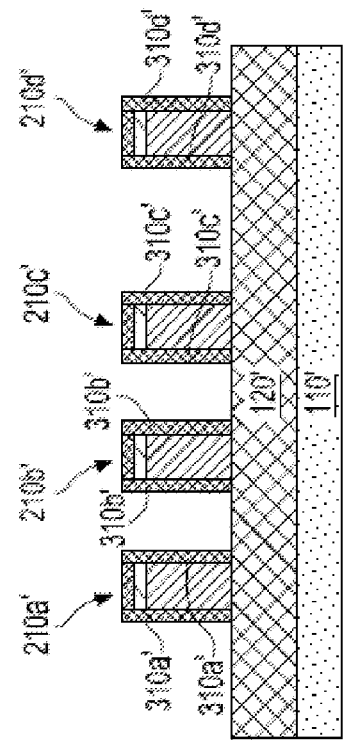
Figure 16E:
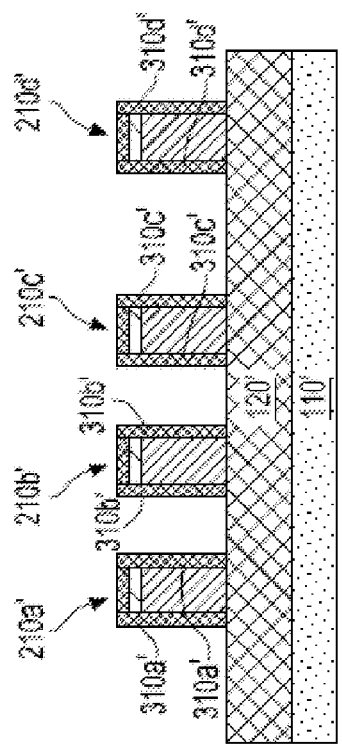

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

First Exemplary Embodiment

Referring to FIGS. 1A-1E depict a stack of layers from which an exemplary embodiment may be constructed. As seen in the side-views depicted in FIGS. 1B-1E, the stack of layers includes a base substrate 110, a buried oxide (BOX) layer 120, a semiconductor-on-insulator (SOI) layer 130, a pad oxide layer 140, and a pad nitride layer 150. Base substrate 110 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. BOX layer 120 may be formed from any of several dielectric materials. Non-limiting examples include, for example, oxides, nitrides and oxynitrides of silicon. Oxides, nitrides and oxynitrides of other elements are also envisioned. In addition, BOX layer 120 may include crystalline or non-crystalline dielectric material. Box layer 120 may be about 100-500 nm thick, preferably about 200 nm. SOI layer 130 may be made of any of the several semiconductor materials possible for base substrate 110. In general, base substrate 110 and SOI layer 130 may include either identical or different semiconducting materials with respect to chemical composition, dopant concentration and crystallographic orientation. SOI layer 130 may be p-doped or n-doped with a dopant concentration in the range of $1\times10^{15}$-$1\times10^{18}/cm^3$, preferably about $1\times10^{15}/cm^3$. SOI layer 130 may be about 50-300 nm thick, preferably about 100 nm. Pad oxide layer 140 may be made of an insulating material such as, for example silicon oxide and may be about 5-20 nm thick, preferably about 10 nm. Pad nitride layer 150 may include an insulating material such as, for example, silicon nitride and may have be about 50-150 nm thick, preferably about 100 nm.

Referring to FIGS. 2A-2E, at least one semiconductor fin 210 is formed by any method known in the art including, for example, photolithography and etching. It should be noted that a single finFET device may have one or more fins. In the depicted embodiment, three fins 210a-210c are formed. Fins 210a-210c contain fin bodies 130a-130c, oxide masks 140a-140c, and nitride masks 150a-150c, respectively. Other embodiments may include as few as one fin. Fins 210a-210c may have a width of 10-50 nm, preferably about 20 nm.

Referring to FIGS. 3A-3E, spacers 310a-310c are deposited on the sides of each semiconductor fin 210a-210c, respectively, by any known method. Spacers 310a-310c may be formed, for example, by depositing a nitride layer over the semiconductor fins 210a-210c and then removing excess material using an anisotropic reactive ion etching (RIE) process (not shown).

Referring to FIGS. 4A-4E and FIGS. 5A-5E, a region 510 is formed in BOX layer 120 by removing material from BOX layer 120. This may be accomplished first by depositing a photoresist layer 410 on the surface of the structure of FIGS. 3A-3E, as depicted in FIGS. 4A-4E, and transferring the pattern of photoresist layer 410 to the BOX layer 120 using a wet etch process, as depicted in FIGS. 5A-5E. The etching process should be selective to remove the material of the BOX layer 120 while not substantially removing any material of the fins 210a-210c. Region 510 should extend fully underneath each fin at depth of about 10-100 nm, preferably 50 nm, as depicted in FIG. 5A. Region 510 should have a width, measured perpendicular to the fins, of about 50-100 nm greater than n*(fin pitch), where n is the number of fins, and a length, measured parallel to the fins, of about 50-100 nm greater than the length of the gate (formed in FIGS. 8A-8E), preferably about 50 nm, with about 25 nm past each side of the gate. The length of fins 210a-210c will be greater than the width of region 510 so that ends of each fins 210a-210c remain in contact with BOX layer 120. After region 510 is etched, photoresist layer 410 is removed (not shown).

Referring to FIGS. 6A-6E, the region 510 (as depicted in FIGS. 5A-5B) may then be filled with a semiconductor layer 610, so that the semiconductor layer 610 contacts the bottom of each fin 210a-210c. Semiconductor layer 610 may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Semiconductor layer 610 may formed by any known method including, for example, a silicon epitaxial growth process.

Referring to FIGS. 7A-7E, an oxide layer 711 is formed on top of semiconductor layer 610. In the depicted embodiment, oxide layer 711 is formed by thermal oxidation, with the unoxidized portion of semiconductor layer 610 forming unoxidized layer 712. The thickness of layer 711 determines the threshold voltage of the parasitic transistor formed. Therefore, oxide layer 711 may be about 5-10 nm thick.

As depicted in FIGS. 8A-8E, a gate 810, consisting of a sacrificial gate 811 and a gate cap 812 are formed over a center portion of each fin 210a-210c. Sacrificial gate 811 may be made of a polysilicon material and may be about 100-200 nm thick, preferably about 100 nm. Gate cap 812 may be made of a nitride material and may be about 20-50 nm thick, preferably about 25 nm. Sacrificial gate 811 and gate cap 812 may be formed through any known method including, for example, depositing sacrificial gate 811 over the surface of the device, planarizing sacrificial gate 811, depositing gate cap 812 on top of sacrificial gate 811, and then removing material from outside the desired area using a reactive ion etching process. Gate 810 may underlap oxide layer 711 and unoxidized layer 712 by a sufficient distance so that a contact may later be formed to the unoxidized layer 712 in the underlapped region, preferably about 100 nm from the last fin edge.

Referring to FIGS. 9A-9E, a spacer 813 is deposited around gate 810. Spacer 813 may be formed, for example, by depositing a nitride layer over gate 810 and then removing excess material using an anisotropic reactive ion etching process (not shown). Spacer 813 must be thick enough to fully cover the sides of oxide layer 711 perpendicular to gate 810, preferably about 10 nm.

Referring to FIGS. 10A-10E, source/drain regions 910a and 910b are formed over fins 210a-210c, in the regions not covered by gate 810 or spacer 813. Spacers 310a-310c, nitride masks 150a-150c, and oxide masks 140a-140c (FIGS. 2A-2E) are removed from the exposed portions of fins 210a-210c (FIGS. 9A-9E) using known etching processes. A silicon-containing semiconductor material is then grown using known epitaxial processes over the exposed portions of fins 210a-210c (FIGS. 9A-9E) to form source/drain regions 910a and 910b. For NMOS finFETs, source/drain regions 910a and 910b may be made of, for example, silicon or silicon carbide with a doping concentration of $1 \times 10^{20}$-$8 \times 10^{20}$/cm$^3$ of arsenic or phosphorus, preferably $5 \times 10^{20}$/cm$^3$. For PMOS finFETs, source/drain regions 910a and 910b may be made of, for example, silicon or silicon germanium with a doping concentration of $1 \times 10^{20}$-$8 \times 10^{20}$/cm$^3$ of boron, preferably $5 \times 10^{20}$/cm$^3$. It should be noted that, while source/drain regions 910a and 910b are depicted as has having uniform geometries in the provided figures, some known epitaxial processes result in non-ideal geometries where faceting may be present.

Referring to FIGS. 11A-11E, an interlevel dielectric (ILD) layer 1010 is deposited over the structure of FIGS. 10A-10E and then planarized, using, for example, chemical mechanical planarization (CMP) to expose the top surface of sacrificial gate 811. ILD layer 1010 may be made of, for example, TEOS, CVD oxide, or a stack of two more insulators including nitrides and oxides.

Referring to FIGS. 12A-12E, sacrificial gate 811 (FIGS. 11A-11E) is removed and replaced with a metal gate, which may include interfacial layers, gate dielectrics, work function metals, and metal fill. Sacrificial gate 811 may be removed by any known method, including for example RIE or a wet etch containing ammonium hydroxide and dilute hydrofluoric acid (not shown). Spacers 310a-310c, oxide masks 140a-140c, and nitrides masks 150a-150c (FIGS. 2A-2E) are then removed from fins 210a-210c in the region exposed by the removal of sacrificial gate 811 (FIGS. 11A-11E). Interfacial layers 1211a-1211c are then formed over fin bodies 130a-130c, respectively. Interfacial layers 1211a-1211c may be formed by oxidizing the exposed surfaces of fins 210a-210c and unoxidized layer 712 using known oxidation methods to form an oxide layer up to 10 angstroms thick. Various layers are then deposited in the region vacated by sacrificial gate 811 (FIGS. 11A-11E). The depicted embodiment includes a gate dielectric layer 1212, Work-function metal 1213, and a metal fill 1214. Gate dielectric layer 1212 may be made of a high-k material and may be approximately 2 nm thick. Work-function metal 1213 may comprise multiple metal-containing layers and may be made of titanium nitride, tantalum nitride, or titanium-aluminum and may be 20-70 angstroms thick. Metal fill 1214 may be made of, for example, aluminum Other embodiments may include more or less metal layers depending on the application and types of device being formed. The composition of each metal layer may also vary and the process of selecting the material for each metal layer is known in the art. The structure is then planarized using chemical-mechanical planarization or any other known method to remove any excess metal from the top surface of ILD layer 1010.

Referring to FIGS. 13A-13E, contacts 1310a-1310d are formed to metal fill 1214, source/drain 910a, source/drain 910b, and unoxidized layer 712. First, contact holes are formed in ILD layer 1010 (shown in FIGS. 12A-12E) using known etching processes to expose a top surface of source/drains 910a and 910b and unoxidized layer 712 outside of metal gate 1210 (not shown). Silicide layers (not shown) are then formed on a top surface of source/drains 910a and 910b and unoxidized layer 712 by depositing a silicide metal, annealing the structure, and then removing unreacted metal (not shown). Silicide metals may include, for example, nickel, platinum, titanium, cobalt or some combination thereof. The contact holes are then filled with a contact metal, for example, copper and the structure is planarized to expose the top surface of metal fill 1214. A dielectric layer 1301 is the deposited on top of the structure and contact holes are formed in dielectric layer 1301 to expose a top surface of metal gate 1210 and a top surface of the earlier formed contacts to source/drains 910a and 910b and unoxidized layer 712. These contact holes are then filled with a contact metal, for example tungsten or copper, to form gate contact 1310a, source/drain contact 1310b, source/drain contact 1310c, and body contact 1310d.

Second Exemplary Embodiment

A second exemplary embodiment of the present invention includes an additional fin in contact with the buried semiconductor layer to potentially simplify formation of the body contact. Structures of the second exemplary embodiment that substantially correspond to structures of the first exemplary embodiment are represented as the prime of the corresponding reference number.

Referring to FIGS. 14A-14E depict a stack of layers from which an exemplary embodiment may be constructed. As seen in the side-views depicted in FIGS. 1B-1E, the stack of layers includes a base substrate 110', a buried oxide (BOX) layer 120', a semiconductor-on-insulator (SOI) layer 130', a pad oxide layer 140', and a pad nitride layer 150'. The thickness and material composition of base substrate 110', buried oxide (BOX) layer 120', semiconductor-on-insulator (SOI) layer 130', pad oxide layer 140' is the same as base substrate 110, buried oxide (BOX) layer 120, semiconductor-on-insulator (SOI) layer 130, pad oxide layer 140, and pad nitride layer 150, respectively.

Referring to FIGS. 15A-15E, at least two semiconductor fins are formed by any known method including, for example, photolithography and etching processes. It should be noted that a single finFET device may have one or more fins. In the depicted embodiment, three transistor fins 210a'-210c' and one body contact fin 210d' are formed. Fins 210a'-210d' contain fin bodies 130a'-130d'. oxide masks 140a'-140d', and nitride masks 150a'-150d', respectively. Other embodiments may include as few one transistor fin. Fins 210a'-210d' may have a width of about 10-50 nm, preferably about 20 nm. Fin 210d' may be formed approximately 100 nm away from the outer edge of the outermost transistor fin, in the depicted embodiment, fin 210c'.

Referring to FIGS. 16A-16E, spacers 310a'-310d' are deposited on the sides of each fin 210a'-210d', respectively, by any known method. Spacers 310a'-310d' may be formed, for example, by depositing a nitride layer over the semiconductor fins 210a'-210d' and then removing excess material using an anisotropic reactive ion etching (RIE) process (not shown).

Figure 18C:
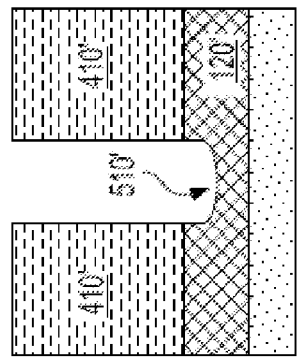
Figure 18B:
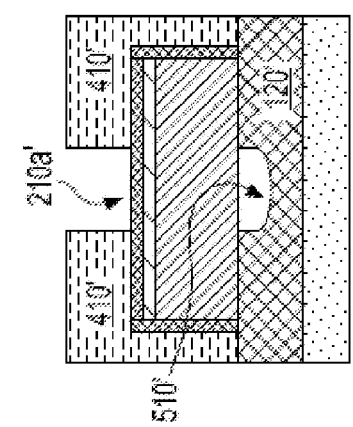
Figure 18A:
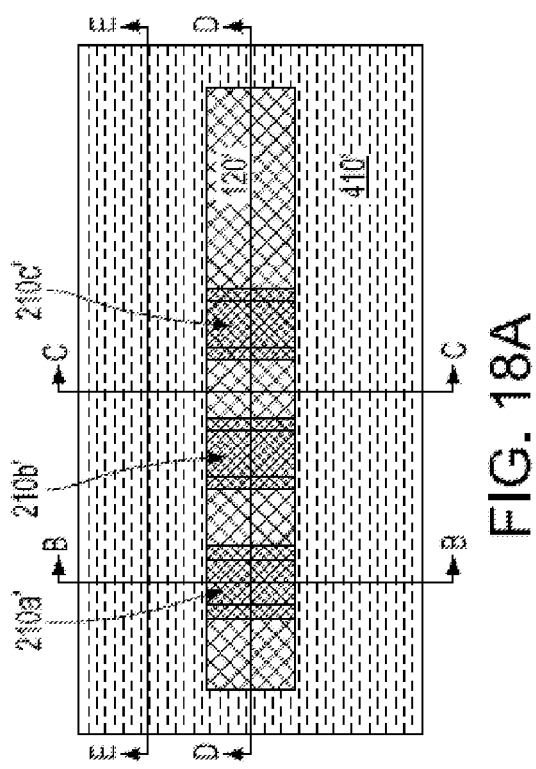
Figure 18E:
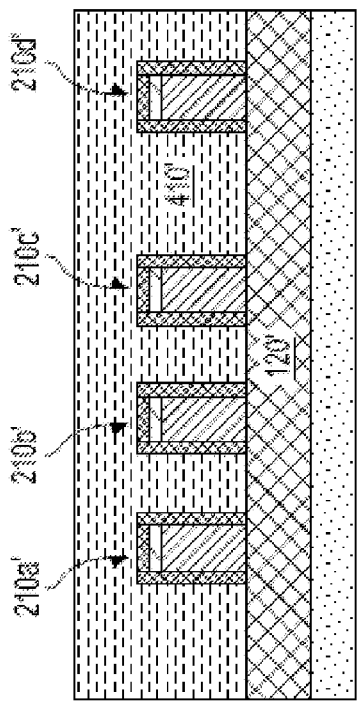
Figure 18D:
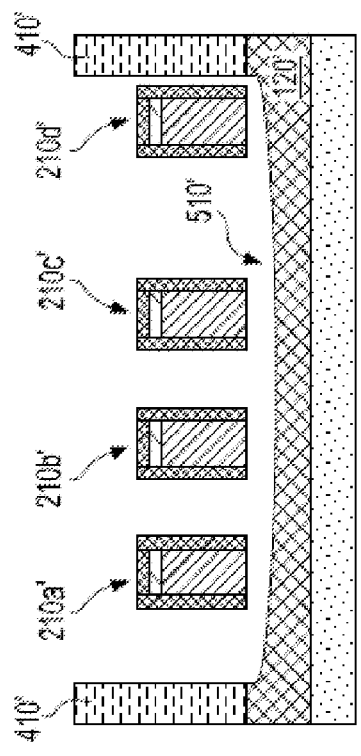
Figure 19C:
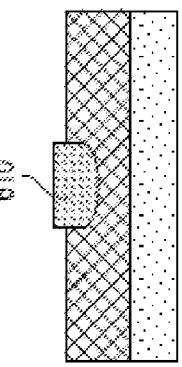
Figure 19B:
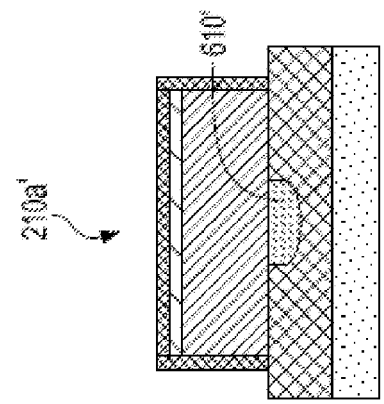
Figure 19E:
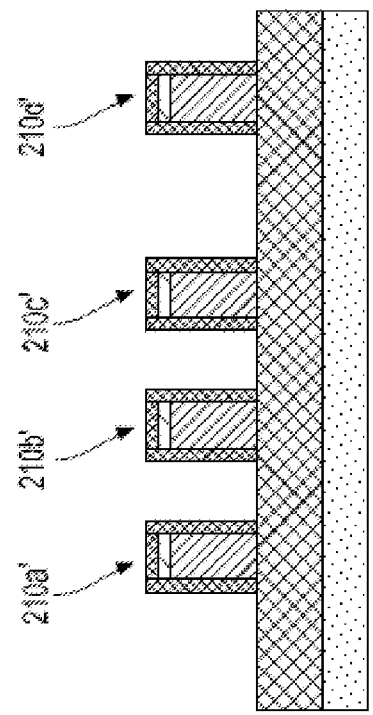
Figure 19A:
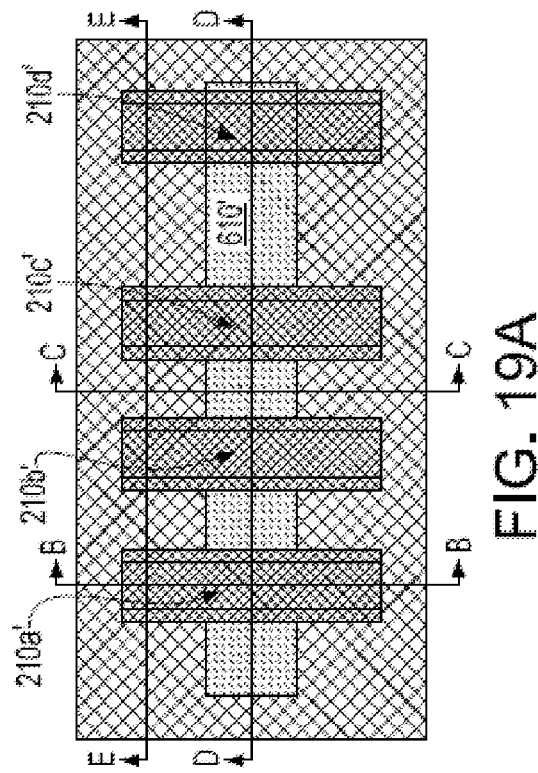
Figure 19D:
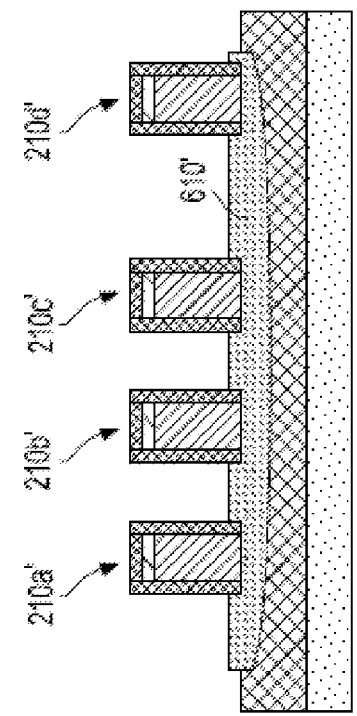
Figure 22A:
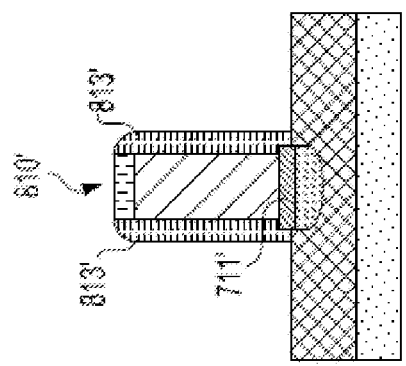
Figure 22B:
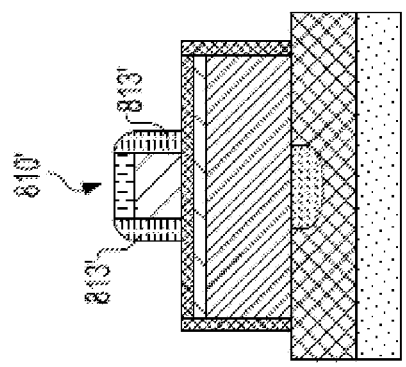
Figure 22C:
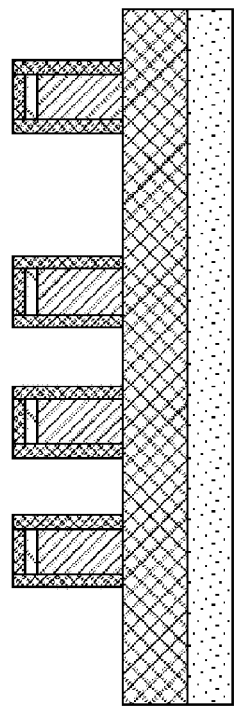
Figure 22D:
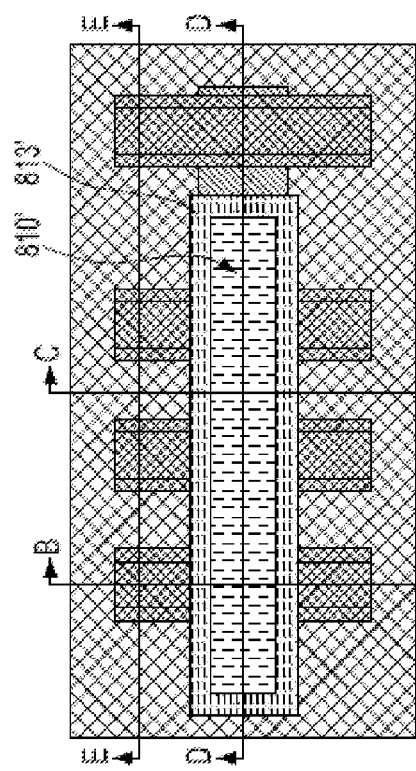
Figure 22E:
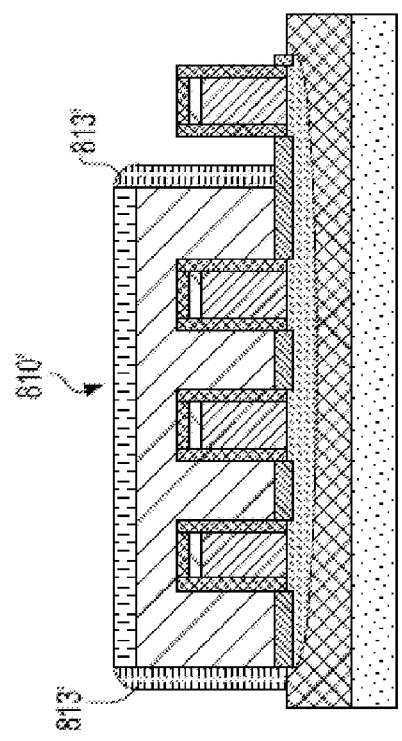
Figure 23A:
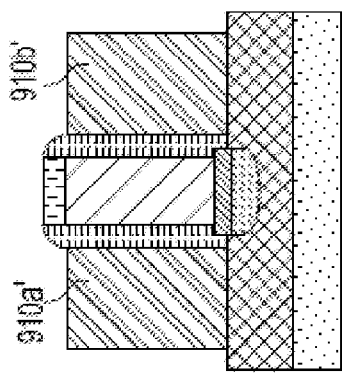
Figure 23B:
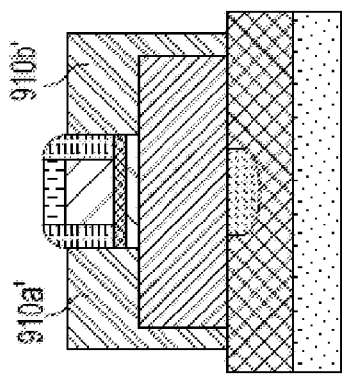
Figure 23C:
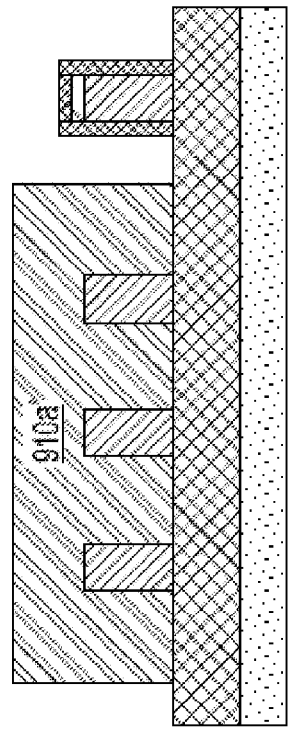
Figure 23D:
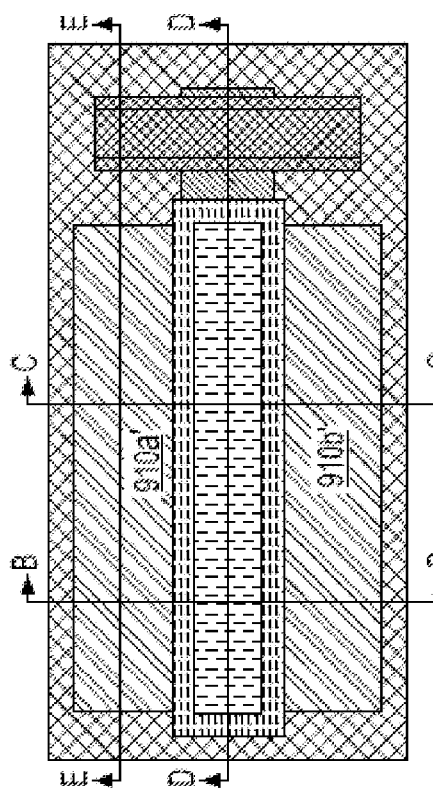
Figure 23E:
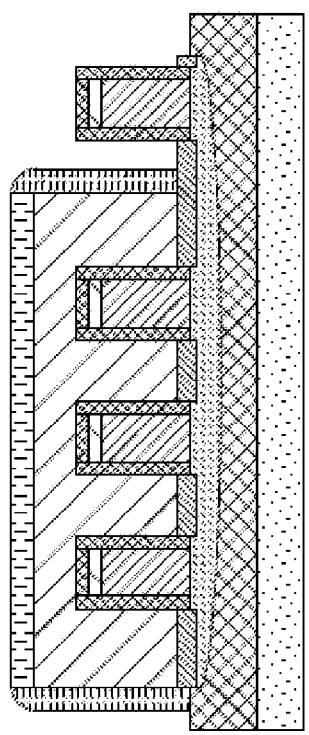
Figure 24C:
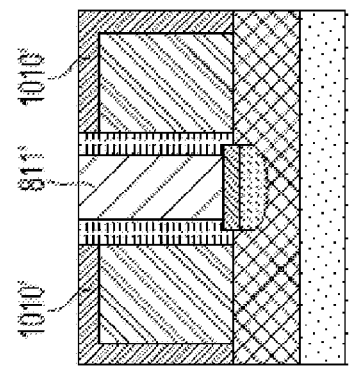
Figure 24B:
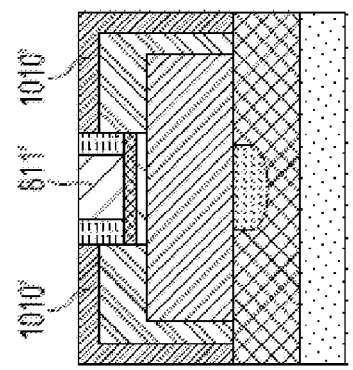
Figure 24E:
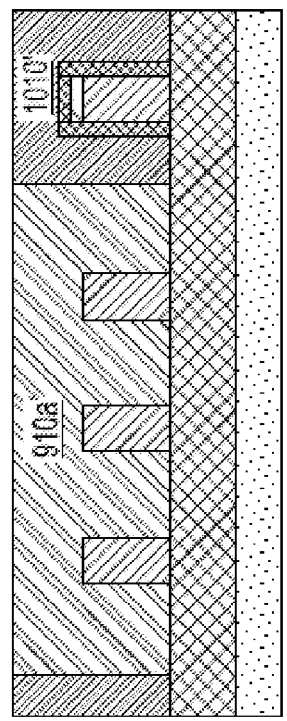
Figure 24A:
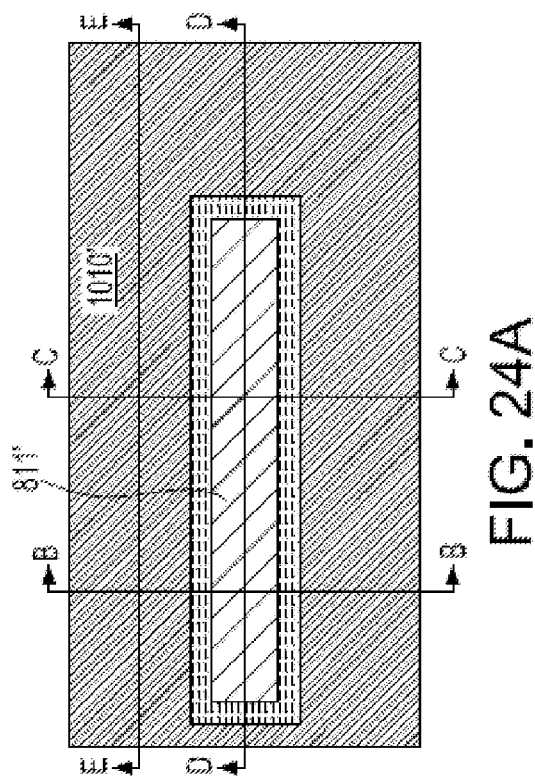
Figure 24D:
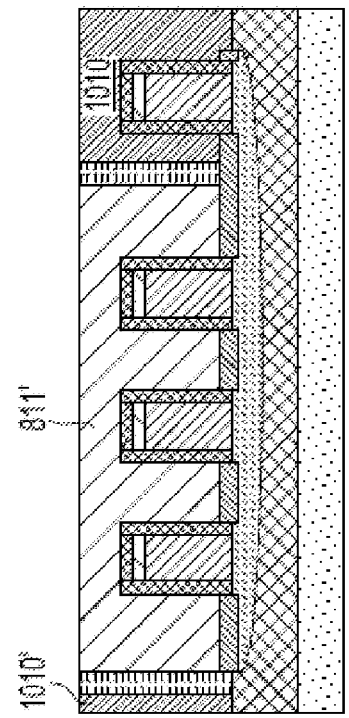

Referring to FIGS. 17A-17E and FIGS. 18A-18E, a region 510' is formed in BOX layer 120' by removing material from BOX layer 120'. This may be accomplished first by depositing a photoresist layer 410' on the surface of the structure of FIGS. 16A-16E, as depicted in FIGS. 17A-17E, and transferring the pattern of photoresist layer 410' to the BOX layer 120'; using a wet etch process, as depicted in FIGS. 18A-18E. The etching process should be selective to remove the material of the BOX layer 120' while not substantially removing any material of the fins 210a'-210d'. Region 510' should extend fully underneath each fin at depth of 10-100 nm, preferably 50 nm, as depicted in FIG. 18A. Region 510' should have a length, measured parallel to the fins, of about 50-100 nm greater than the length of the gate (formed in FIGS. 21A-21E), preferably about 50 nm, with about 25 nm past each side of the gate. The length of fins 210a'-210d' will be greater than the width of region 510' so that ends of each fins 210a'-210d' remain in contact with BOX layer 120'. After region 510' is etched, photoresist layer 410' is removed (not shown).

Referring to FIGS. 19A-19E, the region 510' (as depicted in FIGS. 18A-18B) may then be filled with a semiconductor layer 610', so that the semiconductor layer 610' contacts the bottom of each fin 210a'-210d'. Semiconductor layer 610' may be made of any semiconductor material including, but not limited to: silicon, germanium, silicon-germanium alloy, silicon carbide, silicon-germanium carbide alloy, and compound (e.g. III-V and II-VI) semiconductor materials. Non-limiting examples of compound semiconductor materials include gallium arsenide, indium arsenide, and indium phosphide. Semiconductor layer 610' may be formed by any known method including, for example, a silicon epitaxial growth process.

Referring to FIGS. 20A-20E, an oxide layer 711' is formed on top of semiconductor layer 610'. In the depicted embodiment, oxide layer 711' is formed by thermal oxidation, with the unoxidized portion of semiconductor layer 610' forming unoxidized layer 712'. The thickness of layer 711' determines the threshold voltage of the parasitic transistor formed. Therefore, oxide layer 711' may be about 5-10 nm thick.

As depicted in FIGS. 21A-21E, a gate 810', consisting of a sacrificial gate 811' and a gate cap 812' are formed over a center portion of each fin 210a'-210c'. Fin 210d' is not covered by gate 810', so that a body-contact may be later formed to fin 210d'. The thickness and material composition of sacrificial gate 811' and gate cap 812' may be the same as sacrificial gate 811 and Gate cap 812, respectively. Sacrificial gate 811' and gate cap 812' may be formed through an known method including, for example, depositing sacrificial gate 811' over the surface of the device, planarizing sacrificial gate 811', depositing gate cap 812' on top of sacrificial gate 811', and then removing material from outside the desired area using a reactive ion etching process.

Referring to FIGS. 22A-22E, a spacer 813' is deposited around gate 810'. Spacer 813' may be formed, for example, by depositing a nitride layer over gate 810' and then removing excess material using an anisotropic reactive ion etching process (not shown). Spacer 813' may be thick enough to full cover the sides of oxide layer 711' perpendicular to gate 810', preferably about 10 nm.

Referring to FIGS. 23A-23E, source/drain regions 910a' and 910b' are formed over fins 210a'-210c', in the regions not covered by gate 810' or spacer 813'. Spacers 310a'-310c', nitride masks 150a'-150c', and oxide masks 140a'-140c' (FIGS. 15A-15E) are removed from the exposed portions of fins 210a'-210c' (FIGS. 22A-22E) using known etching processes. A silicon-containing semiconductor material is then grown using known epitaxial processes over the exposed portions of fins 210'a-210c' (FIGS. 22A-22E) to form source/drain regions 910a' and 910b'. The thickness and material composition of source/drain regions 910a' and 910b' may the same as source/drain regions 910a and 910b. It should be noted that, while source/drain regions 910a' and 910b' are depicted as has having uniform geometries in the provided figures, some known epitaxial processes result in non-ideal geometries where faceting may be present.

Referring to FIGS. 24A-24E, an interlevel dielectric (ILD) layer 1010' is deposited over the structure of FIGS. 10A-10E (not shown) and then planarized, using, for example, chemical mechanical planarization (CMP) to expose the top surface of sacrificial gate 811'. ILD layer 1010' may be made of, for example, TEOS, CVD oxide, or a stack of two more insulators including nitrides and oxides.

Referring to FIGS. 25A-25E, sacrificial gate 811' (FIGS. 11A-11E) is removed and replaced with a metal gate, which may include interfacial layers, gate dielectrics, work function metals, and metal fill. Sacrificial gate 811' may be removed by any known method, including for example RIE or a wet etch containing ammonium hydroxide and dilute hydrofluoric acid (not shown). Spacers 310a'-310c', oxide masks 140a'-140c', and nitrides masks 150a'-150c' (FIGS. 15A-15E) are then removed from fins 210a'-210c' in the region exposed by the removal of sacrificial gate 811' (FIGS. 24A-24E). Interfacial layers 1211a'-1211c', gate dielectric layer 1212', work-function metal 1213', and metal fill 1214' are then formed in the same manner as interfacial layers 1211a-1211c, gate dielectric layer 1212, Work-function metal 1213, and metal fill 1214 of the first exemplary embodiment. Other embodiments may include more or less metal layers depending on the application and types of device or devices being formed. The composition of each metal layer may also vary and the process of selecting the material for each metal layer is known in the art. The structure is then planarized using chemical-mechanical planarization or any other known method to remove any excess metal from the top surface of ILD layer 1010'.

Referring to FIGS. 26A-26E, contacts 1310a'-1310d' are formed to metal gate 1210', source/drain 910a', source/drain 910b', and fin body 130d' of fin 210d'. First, contact holes are formed in ILD layer 1010' using known etching processes to expose a top surface of source/drains 910a' and 910b' and fin body 130d' (not shown). Silicide layers (not shown) are then formed on a top surface of source/drains 910a' and 910b' and fin body 130d' by depositing a silicide metal, annealing the structure, and then removing unreacted metal (not shown). Silicide metals may include, for example, nickel, platinum, titanium, cobalt or some combination thereof. The contact holes are then filled with a contact metal, for example, copper and the structure is planarized to expose the top surface of metal fill 1214'. A second dielectric layer 1301' is then deposited on top of the structure and contact holes are formed in dielectric layer 1301' to expose a top surface of metal gate 1210' and a top surface of the earlier formed contacts to source/drains 910a' and 910b' and fin body 130d'. These contact holes are then filled with a contact metal, for example tungsten or copper, to form gate contact 1310a', source/drain contact 1310b', source/drain contact 1310c', and body contact 1310d'.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A method of manufacturing a body contact of a finFET structure, the method comprising:
    forming a fin directly on a first insulator layer, wherein a bottom surface of the fin is in contact with an upper surface of the first insulator layer;
    removing a portion of the first insulator layer selective to the fin without removing a portion of the bottom surface of the fin to form a recess region underneath a portion of a length of the fin, wherein the recess region exposes an entire width of the bottom surface of the portion of the fin;
    growing an epitaxial semiconductive layer within the recess region, wherein the semiconductive layer is in contact with the bottom surface of the fin; and
    forming a second insulator layer on a top surface of the semiconductive layer.

2. The method of claim 1, wherein the removing the portion of the first insulator layer selective to the fin to form the recess region underneath the portion of the length of the fin comprises wet etching the first insulator layer to form a concave empty region within the first insulator layer.

3. The method of claim 1, wherein forming the second insulator layer on the top surface of the semiconductor layer comprises depositing a silicon oxide on the top surface of the semiconductive layer.

4. The method of claim 1, wherein forming the second insulator layer on the top surface of the semiconductor layer comprises thermally oxidizing the top surface of the semiconductive layer.

5. The method of claim 1, further comprising forming the body contact electrically connected to the semiconductive layer.

* * * * *